United States Patent
Mohammad et al.

(10) Patent No.: US 11,480,695 B2
(45) Date of Patent: Oct. 25, 2022

(54) MEMRISTOR BASED SENSOR FOR RADIATION DETECTION

(71) Applicant: Khalifa University of Science and Technology, Abu Dhabi (AE)

(72) Inventors: Baker Mohammad, Abu Dhabi (AE); Maguy Abi Jaoude, Abu Dhabi (AE); Heba Abunahla, Abu Dhabi (AE); Mahmoud Al-Qutayri, Abu Dhabi (AE); Curtis O'Kelly, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 0 days.

(21) Appl. No.: 17/377,219

(22) Filed: Jul. 15, 2021

(65) Prior Publication Data
US 2021/0341634 A1 Nov. 4, 2021

Related U.S. Application Data

(63) Continuation of application No. 16/067,534, filed as application No. PCT/IB2016/058126 on Dec. 30, 2016, now Pat. No. 11,105,937.
(Continued)

(51) Int. Cl.
*G01T 1/24* (2006.01)
*G01T 1/02* (2006.01)
(Continued)

(52) U.S. Cl.
CPC ............ *G01T 1/245* (2013.01); *G01T 1/02* (2013.01); *G01T 1/17* (2013.01); *G01T 1/241* (2013.01); *H01L 45/146* (2013.01)

(58) Field of Classification Search
CPC .. G01T 1/245; G01T 1/02; G01T 1/17; G01T 1/241; H01L 45/146
See application file for complete search history.

(56) References Cited

U.S. PATENT DOCUMENTS

| | | | |
|---|---|---|---|
| 3,119,036 A | 1/1964 | Braestrup et al. | |
| 3,790,794 A | * 2/1974 | Murray | G01T 1/12 250/370.07 |

(Continued)

FOREIGN PATENT DOCUMENTS

WO 2017115340 7/2017

OTHER PUBLICATIONS

U.S. Appl. No. 16/067,534, Final Office Action, dated Jan. 8, 2021, 21 pages.
(Continued)

*Primary Examiner* — Blake C Riddick
(74) *Attorney, Agent, or Firm* — Kilpatrick Townsend & Stockton LLP

(57) ABSTRACT

Devices, systems, and methods of using one or more memristors as a radiation sensor are enabled. A memristor can be attractive as a sensor due to its passive low power characteristics. Medical and environment monitoring are contemplated use cases. Sensing radiation as part of a security system (at an airport for example) and screening food for radiation exposure are also possible uses. The memristor as a radiation sensor may possibly provide an inexpensive and easy alternative to personal thermoluminescent dosimeters (TLD). Memristor devices with high current and low power operation may be attached with wearable plastic substrates. An example device includes two metal strips with a 50 μm thick layer of $TiO_2$ memristor material. The device may be made large relative to traditional memristors which are nanometers in scale but its increased thickness can significantly increase the probability of radiation interaction with the memristor material.

20 Claims, 19 Drawing Sheets

Related U.S. Application Data

(60) Provisional application No. 62/273,841, filed on Dec. 31, 2015.

(51) Int. Cl.
    *G01T 1/17*     (2006.01)
    *H01L 45/00*     (2006.01)

(56) References Cited

U.S. PATENT DOCUMENTS

| | | | |
|---|---|---|---|
| 7,636,419 B1 | 12/2009 | Nelson | |
| 8,575,560 B1 * | 11/2013 | Fechner | G01T 1/245 250/370.14 |
| 9,887,352 B2 | 2/2018 | Bessonov et al. | |
| 2003/0205675 A1 | 11/2003 | Nelson et al. | |
| 2005/0019757 A1 | 1/2005 | Stolarchuk | |
| 2011/0017977 A1 | 1/2011 | Bratkovski et al. | |
| 2011/0266513 A1 | 11/2011 | Williams et al. | |
| 2012/0014175 A1 | 1/2012 | Wang et al. | |
| 2012/0074372 A1 | 3/2012 | Yang et al. | |
| 2012/0132880 A1 | 5/2012 | Bratkovski et al. | |
| 2013/0130261 A1 | 5/2013 | Prodromakis et al. | |
| 2014/0077090 A1 | 3/2014 | Roy | |
| 2014/0113828 A1 | 4/2014 | Gilbert et al. | |
| 2014/0185927 A1 | 7/2014 | Kawabata et al. | |
| 2014/0264048 A1 | 9/2014 | Stubbers et al. | |
| 2015/0090953 A1 | 4/2015 | Boland et al. | |
| 2015/0114927 A1 | 4/2015 | Yang et al. | |
| 2015/0149517 A1 | 5/2015 | Matthews | |
| 2016/0271947 A1 | 9/2016 | Yang et al. | |
| 2017/0248442 A1 | 8/2017 | Gartseev et al. | |
| 2017/0250223 A1 | 8/2017 | Ge et al. | |
| 2017/0317680 A1 | 11/2017 | Ge et al. | |
| 2017/0372782 A1 | 12/2017 | Gibson et al. | |
| 2018/0031729 A1 | 2/2018 | Maguire-Boyle et al. | |
| 2018/0113330 A1 | 4/2018 | Maguire-Boyle et al. | |

OTHER PUBLICATIONS

U.S. Appl. No. 16/067,534, Non-Final Office Action, dated Aug. 5, 2020, 23 pages.

U.S. Appl. No. 16/067,534, "Notice Of Allowance", dated Apr. 23, 2021, 10 pages.

Gergel-Hackett et al., "A Flexible Solution-Processed Memristor", Institute of Electrical and Electronics Engineers, Electron Device Letters, vol. 30, No. 7, Jul. 2009, pp. 706-708.

McLain et al., "The Susceptibility of TaOx-based Memristors to High Dose Rate Ionizing Radiation and Total Ionizing Dose", Institute of Electrical and Electronics Engineers, Transactions on Nuclear Science, vol. 61, No. 6, Dec. 2014, pp. 2997-3004.

Application No. PCT/IB2016/058126, International Preliminary Report on Patentability, dated Jul. 12, 2018, 6 pages.

Application No. PCT/IB2016/058126, International Search Report and Written Opinion, dated Mar. 27, 2017, 9 pages.

Prodromakis et al., "A Review on Memristive Devices and Applications", Electronics, Circuits, and Systems (ICECS), 17th IEEE International Conference, Dec. 12-15, 2010, pp. 936-939.

\* cited by examiner

| Device | Electrodes | Coating source (resulting switching layers)[a] | Resistance behavior[b] |
|---|---|---|---|
| D1 | Al/Al | Precursor solution (TiO$_2$/TiO$_2$) | Unipolar switching with dynamically increasing intrinsic resistance (R$_{OFF}$/R$_{ON}$ < 10 and depends on voltage) |
| D2 | Al/Cu | Precursor solution (TiO$_2$/Cu$^{(8H)}$—TiO$_2$) | Bipolar switching at low voltage (R$_{OFF}$/R$_{ON}$ ~10$^6$, at −1 V and 100 mA cc) |
| B2' | Al/Cu | Precursor solution w/o ethanolamine additive (TiO$_2$/TiO$_2$) | No switching event (highly resistive stack) |
| D2'' | Al/Cu | Pure ethanolamine on Cu (Cu$^{(8H)}$O$_x$) | Ohmic current regime (constant resistance at room temperature) |
| D3 | Cu/Cu | Precursor solution (Cu$^{(8H)}$—TiO$_2$/Cu$^{(8H)}$—TiO$_2$) | Single switching event (R$_{OFF}$/R$_{ON}$ ~10$^3$, at −1 V and 100 mA cc) |

FIG. 14

MEMRISTOR BASED SENSOR FOR RADIATION DETECTION

CROSS-REFERENCES TO RELATED APPLICATIONS

This application is a continuation of U.S. application Ser. No. 16/067,534, filed on Jun. 29, 2018, which is a U.S. 371 of the International Application No. PCT/IB2016/058126, filed Dec. 30, 2016, which claims the benefit of U.S. Provisional Application No. 62/273,841, filed Dec. 31, 2015, the full benefit of which is incorporated by reference in their entirety for all purposes.

TECHNICAL FIELD

This invention relates generally to electronic devices and more particularly to electronic devices capable of acting as sensors.

BACKGROUND

Existing radiation detection technologies can typified as follows: (Type I) charge-collecting, (Type II) light-collecting, or (Type III) heat-collecting (calorimetric). Type I and Type II schemes are most common for in-situ or in-the-field detection scenarios requiring portability and time-resolved detection. Type III is almost exclusively an in-vitro laboratory/analytical technique. In principle, each kind of radiation can be detected using each type of technology, but each kind of ionizing radiation interacts with matter in distinct ways, making some detection types more or less effective and efficient for a given kind of radiation.

Ionizing radiations are those with sufficient energy to ionize other matter, causing structural changes to the impacted material. Ionizing radiation itself is emitted during structural changes to the atomic nucleus or inner most atomic electrons, processes which occur spontaneously in nature (radioactive decay) or can be induced artificially (in reactors and accelerators). Ionizing radiation comes in several types: (1) gamma rays or x-rays (high energy photons), (2) beta-particles (high energy electrons or positrons), (2) alpha particles (high energy helium nuclei) or (4) neutrons (one of the principle components of the atomic nucleus).

Gamma rays and x-rays are high energy photons, having no mass and no electrical charge, and so can penetrate through large material thicknesses (cm to m) with minimal interactions. When gamma rays do interact, it's primarily with the atomic electrons in the material through the processes of photoelectric ejection, Compton scattering and electron-positron pair production. A Type-II approach to gamma ray detection which is also effective is to convert the small charge produced in matter interaction processes into scintillation (light), using special crystalline solids such as sodium-iodide (NaI), then collect the light with charge-coupled devices (CCD) or photo-multiplier tubes (PMT).

Alpha and beta particles both have mass and electrical charge and so interact much more strongly with materials, penetrating micrometers to cm into most materials, before losing their energy. Many Type-I detection technologies for detecting alpha and beta particles directly rely on large, gas filled volumes under large voltage bias which undergo avalanche when the alpha or beta particle enters the gas volume. Alternatively, Type I approaches using semiconductors have been used ("surface barrier" detectors), provided the depletion region of the diode can be exposed to the radiation source directly, so that the alpha and beta particles do not have to transit packaging materials which might stop them completely. Semiconductor surface barrier detectors for alpha and beta radiations often have to be operated near the source with both in vacuum. Type II and Type III detectors for alpha and beta radiations require lengthy nuclear chemistry protocols, to separate the radioactive material from source samples, which would otherwise self-attenuate the radiation prior to detection, and to disperse them into solution, either with (Type II) or without (Type III) bonding them to scintillating compounds as part of the preparation.

Neutrons are massive but carry no electrical change, and interact with other atomic nuclei, making their range and path in material long and complex, producing no direct free charge, light, or heat during most interactions. Technologies to date for detecting neutrons rely on converting the neutron field to a different radiation field that is more easily detected. For fast neutrons, the Type II approach can be used, whereby plastic scintillators made of hydrogen-rich compounds emit detectable flashes of light when protons in the plastic are dislodged by neutron collisions. For slower neutrons, nuclear reactions such as $^{10}B+n \rightarrow ^7Li+\alpha$ convert the neutron by nuclear absorption and emission of a high energy $^7Li$ nucleus and an alpha particle which are then detected by Type I gas ionization as discussed above.

Naturally occurring radioactive materials (NORM) and natural radiation are ubiquitous and are found associated with uranium or thorium bearing ores, aggregation of oil & gas byproducts, in potassium-containing materials such as concrete and bananas, and have even been recently detected during lighting strikes at ground level and in super-cell thunderstorms by satellites. Radiation is also a natural byproduct of fusion and other processes in the Sun, and so is a ubiquitous part of the space weather satellite operating environment. Artificial radioactive materials and their associated radiations are produced and used in a wide variety of industrial, medical and military applications, including welding inspections, quality control in textile manufacturing, cancer imaging and treatment, power production and weapons testing. In the above instances, the identification and distinction among natural and artificial processes and radioactive materials relies on detecting and classifying the emitted radiations.

However, conventional solutions to the problems of radiation detection have shortcomings. For example, some conventional solutions are costly, bulky, inefficient (e.g., with respect to power consumption, resource utilization, and/or physical space utilization), ineffective (e.g., with respect to some radiation detection performance criteria for some particular application), and/or require additional equipment such as detector readers. As further examples, some conventional solutions have a high power supply requirement, time consuming readout and calibration, lack of accuracy, low spatial resolution, and/or dynamic sensitivity with accumulated dose or temperature change.

SUMMARY

Radiation may be measured at least in part by exposing a memristor to radiation during a first period of time, measuring a signal current through the memristor after the first period of time while a voltage value is applied to the memristor, and generating a radiation measurement based at least in part on the signal current measurement. A sensor for measuring radiation may include a memristor. The memristor may include a positive electrode for coupling to a positive terminal of a voltage source; a negative electrode for coupling to a negative terminal of the voltage source; and an active memristor material disposed between the first electrode and the second electrode such that the active memristor material is positioned to receive ambient radiation.

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below.

Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim.

BRIEF DESCRIPTION OF THE DRAWINGS

Various embodiments in accordance with the present disclosure will be described with reference to the drawings, in which:

FIG. 14 is a table depicting aspects of example device characteristics in accordance with at least one embodiment of the invention;

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

In accordance with at least one embodiment of the invention, devices, systems, and methods of using one or more memristors as a radiation sensor are enabled. A memristor can be attractive as a sensor due to its passive low power characteristics. The role of radiation and its ability to interact with memristor materials and produce measurable lasting changes in the memristor has many potential applications. Medical and environment monitoring are contemplated use cases. Sensing radiation as part of a security system (at an airport for example) and screening food for radiation exposure are also possible uses. The memristor as a radiation sensor may possibly provide an inexpensive and easy alternative to personal thermoluminescent dosimeters (TLD). In accordance with at least one embodiment of the invention, memristor devices with high current and low power operation may be attached with wearable plastic substrates. An example device includes two metal strips with a 50 μm thick layer of $TiO_2$ memristor material. The device may be made large relative to traditional memristors which are nanometers in scale but its increased thickness can significantly increase the probability of radiation interaction with the memristor material.

Figure 1:
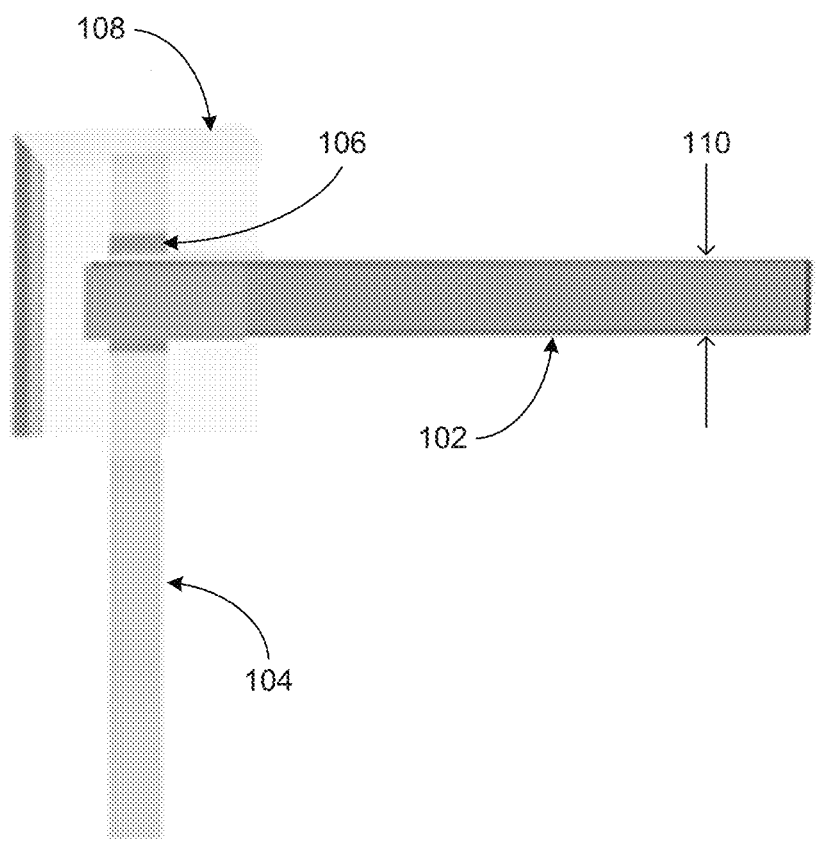
FIG. 1 is a schematic diagram depicting aspects of an example memristor-based sensor in accordance with at least one embodiment of the invention.
Figure 2:
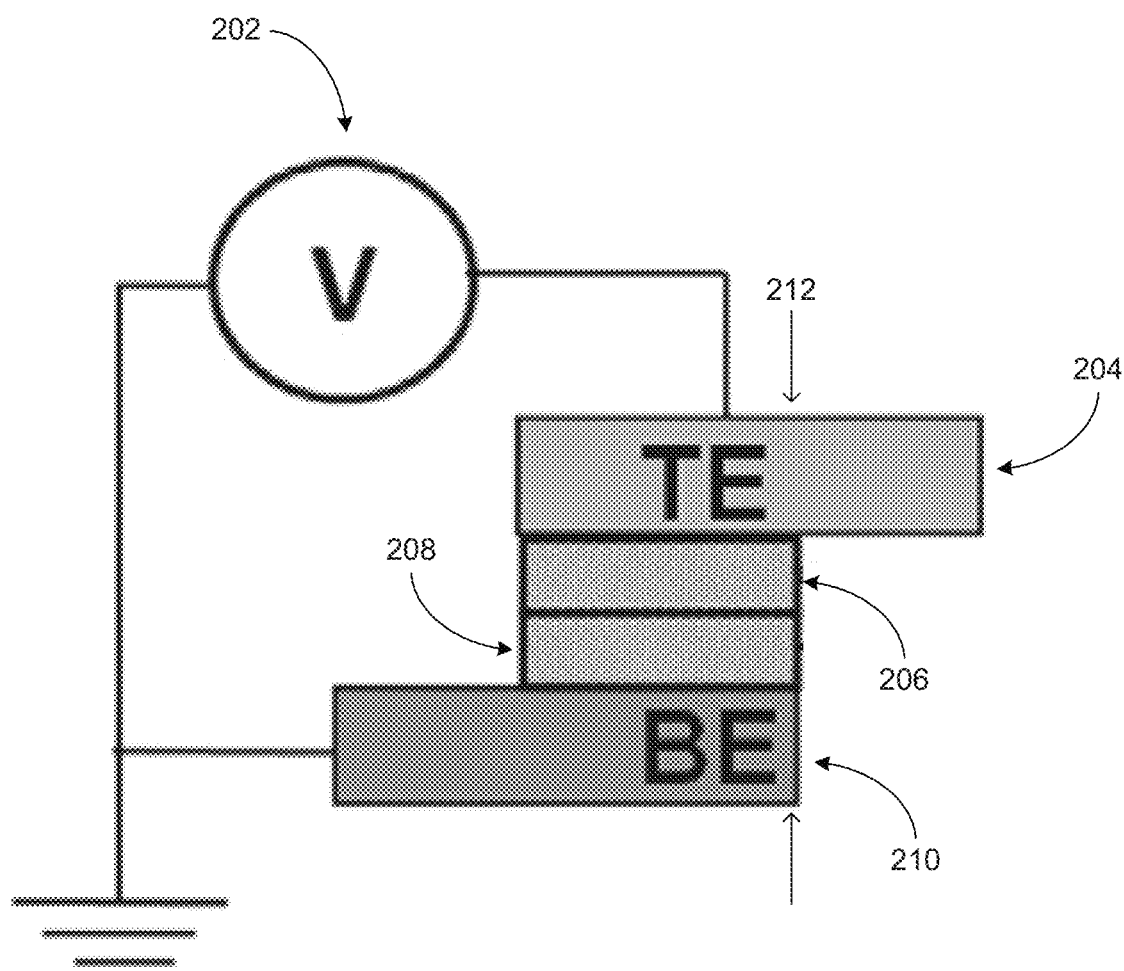
FIG. 2 is a schematic diagram depicting aspects of an example memristive device in accordance with at least one embodiment of the invention.

FIG. 1 depicts an example device 100 including orthogonally stacked electrodes 102, 104 (e.g., copper or aluminum) having width 110, $TiO_2$-based thin film 106 and a supportive plastic substrate 108. The device 100 may be sensitive to different radiation particles, and a transition 402 (see FIG. 4, described in more detail below) may be observed when the device is exposed to low-level gamma radiation, e.g., from a 137-Cesium radiation source. FIG. 2 depicts a memristive device 200 in a circuit in accordance with at least one embodiment of the invention. The memristive device 200 is an example of the device 100 (FIG. 1). A voltage 202 is applied across the device layers including the top electrode (TE) 204, one or more metal oxide layers 206, 208 and a bottom electrode (BE) 210, having a total thickness 212.

Figure 3:
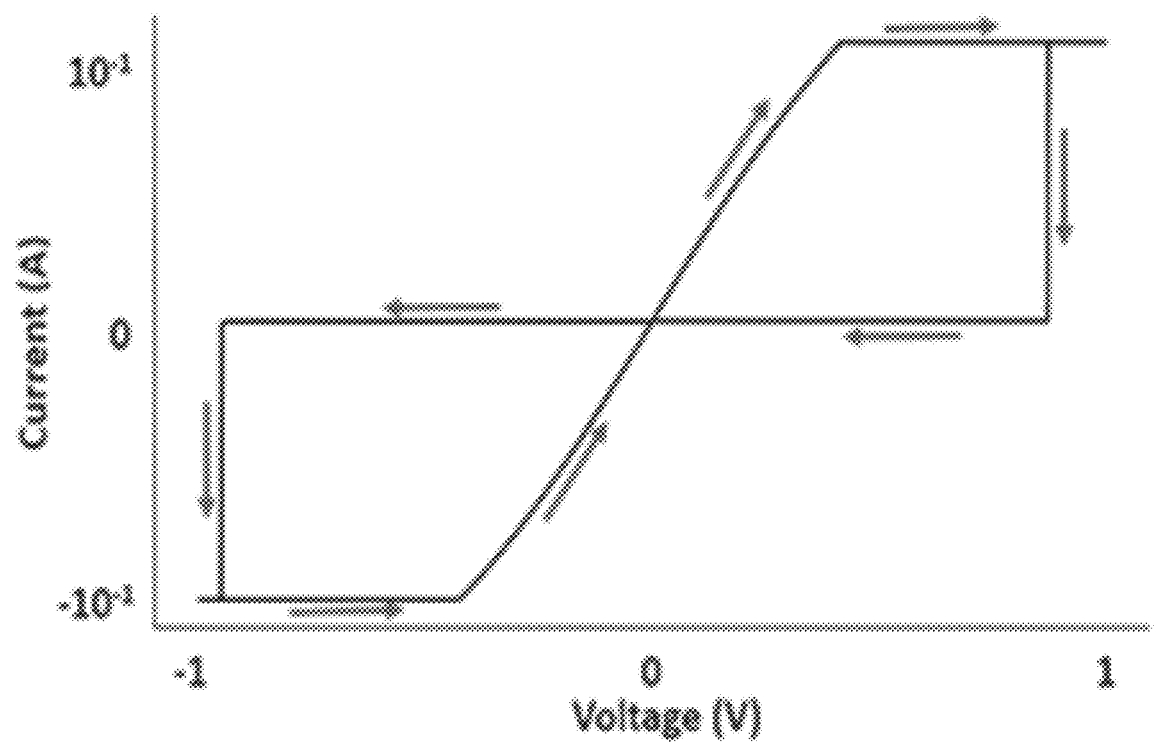
FIG. 3 is a graph depicting aspects of example device characteristics in accordance with at least one embodiment of the invention.

Memristors are a class of resistance switching semiconductor memories (RRAM) that may operate with low power continuous analog signals. These devices may have a property that links the resistance of the material to a history of a voltage applied to the material. This property may enable the resistance of the material to be tuned through the application of voltage pulses until the desired resistance state is obtained enabling multilevel resistance states or continuum resistance levels. Change in the resistance may be maintained in the material after the removal of power establishing it as a non-volatile memory technology. A memristor may include a metal insulator metal structure with noble or inert metals acting as the electrodes and transition metal oxides, perovkites and/or nitrides as the active material that dynamically changes in response to applied voltage bias. FIG. 3 depicts aspects of an example electronic response 300 of a memristive device in accordance with at least one embodiment of the invention (e.g., the memristor 100 depicted in FIG. 1) with high current levels and low voltage resistive switching. As an example, the electrodes 102, 104 may be relatively wide (e.g., on the order of millimeters including 1 mm, more than 1 mm, 2 mm, more than 2 mm, 3 mm, 4 mm, 5 mm, 1-2 mm, 1-3 mm, 1-5 mm and more). A relatively large size of the active layer (e.g., electrodes and oxide layers) thickness (e.g., on the order of hundreds of millimeters including 200 μm, more than 200 μm, 300 μm, more than 300 μm, 400 μm, more than 400 μm, 400 μm, 200-300 μm, 200-400 μm, and more) and area can enhance the probability of interaction between the active layer and applied radiation. As an example, the electrode layers may be approximately 50 μm, and the oxide layers may be 200±50 μm. Memristors may have a continuous analog signal output which is conformal to sensing applications, synapse emulation, and neuromorphic computation.

For example, redox based resistance switching ReRAM technologies may change resistance based on chemical oxidation and reduction changes within the material. The chemical oxidation may be induced/driven by external stimulus applied to the device such as voltage bias applied to an electrode, joule heating within the material or laser light illumination (photo-doped). Radiation sources such as gamma ("g-ray") and x-ray can be exploited to drive the chemistry needed to induce the resistance change.

The device contacts may be inert metal electrodes that essentially act as catalysts for the oxidation and reduction under applied bias. The voltage bias drives electrochemical oxidation/reduction reactions in the active material creating charged ion within the material. These charged ions essentially behave as dopants within the active material increasing the conduction of the material. The ionic dopants provide accessible energy levels within the band gap of the material thereby improving conduction. Radiation has the potential to mimic the above mentioned established physical mechanisms for introducing the ionic dopants within the device.

Under voltage bias, oxidation reaction proceeds via established solid state reactions where the material at the interface captures or loses electrons changing its oxidation state. Joule heating is a similar mechanism that drives oxidation but with increased heat and highly localized electric fields within the material. The equation defining Joule heating reveals another possible route for high energy radiation to interact with memristor materials;

$$JE = E^2 \cdot e(n\mu_e + p\mu_h) \quad (1)$$

Where J is the current density, E is the electric field, e is the electronic charge, n and p are the number of electrons and holes in the material and μ is the mobility of the electrons and holes. From this equation it is possible to infer that increasing n and p within a material using radiation sources (and bandgap threshold light) should increase the Joule heating oxidation of ionic dopants for a measurable change in resistance.

Figure 4:
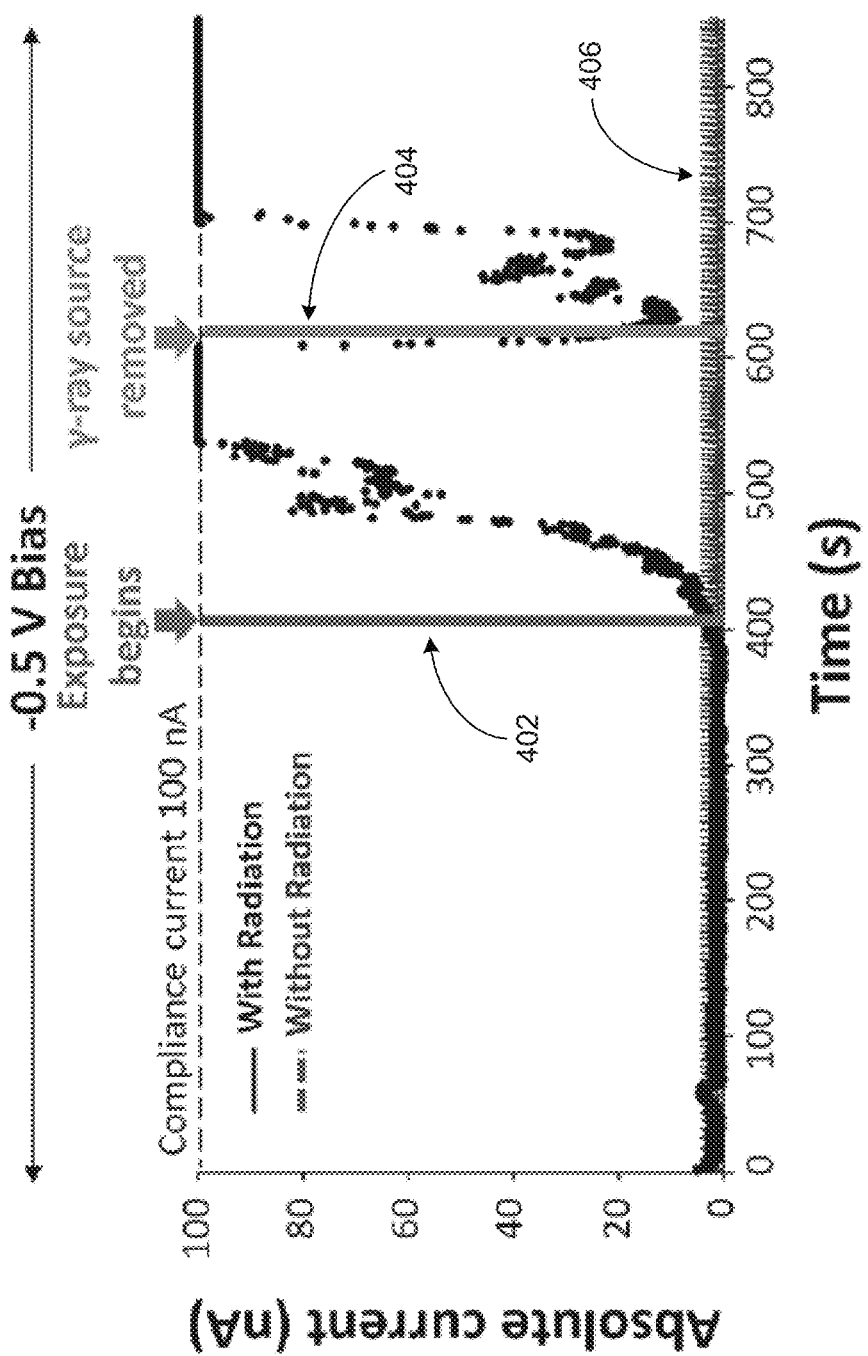
FIG. 4 is a graph depicting aspects of example device characteristics in accordance with at least one embodiment of the invention.
Figure 5:
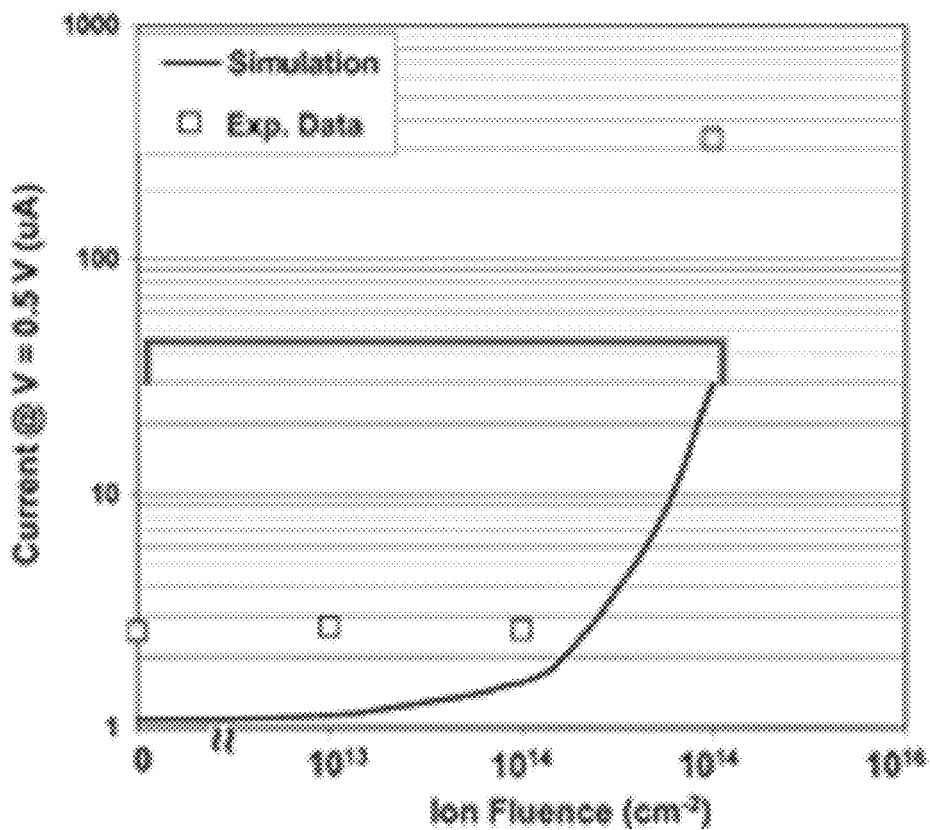
FIG. 5 is a graph depicting aspects of example device characteristics in accordance with at least one embodiment of the invention.

Once the ionic dopants are introduced into the memristor material the ions may move and re-orientate in the active material in response to the applied electric field. A common example given is the oxygen vacancy anion, which will migrate to the positive electrode increasing the vacancy dopant concentration at the cathode interface. The change in anion concentration is measured as a change in resistance of the device which is monitored in real time through the application of a read voltage which is below the threshold required to drive ion creation. FIG. 4 shows a dynamically changing vacancy population 400 within a micro memristor device after the application of a Cs-137 radiation source. Under the application of 0.5 V the device has a stable unchanging current in the nA range. The Cs-137 source is applied at 400 seconds (at 402). Within 20 s the current is seen to increase tenfold, after 100 seconds the device current hits the instrument compliance which is set at 100 nA. The radiation source may introduce conductivity changing dopants into the memristive device enabling it to reach compliance. Upon removal of the radiation source at 625 seconds (at 404), the current drops as electron hole pairs introduced by the radiation recombine, the ionic dopants produced by the radiation persist within the device and 100 seconds after the radiation source is removed the device again reaches compliance current. In FIG. 5 a simulated response 500 of alpha particle radiation source exposed to a memristor is shown. Interaction of radiation with memristors can produce measurable changes in the material.

Micro-sized memristor devices may be fabricated using solution-based casting techniques for deposition of the metal-oxide insulator layer (e.g., drop coating, knife-casting, spraying or spin coating). Various transition metal oxides, associated with TiO2, HfO2, CuO, ZnO and WO3 chemistry may be screened and tailored in terms of functionality and morphology, to optimize the device's capability of sensing ionizing radiation. Metal sheets comprising of aluminum, copper and inert materials, such as platinum may be suitable as electrode components. Characterization of the memristors may be carried out with Keithley-Semiconductor Device Analyzer that measures the IV/Cv curve characteristics of memristor devices.

A low-power, solid-state, resistive (current-based read out) radiation detector does not conform to any of the existing detection or dosimetry types. A memristor radiation detector may be a substitute for a TLD, but one that can be electronically "read out" cheaply as part of a simple circuit and in-situ, obviating the need for expensive, offline TLD reader equipment. Such a memristor detector may be useful in a large variety of applications.

Low power requirements, low weight and small size can make memristor based detectors a desirable basis for radiation detection on space-based platforms because of large costs associated with payload weight and the need for high power efficiency away from supply mains. A memristor can serve as an inexpensive alternative technology to TLD which requires expensive TLD reader machines to recover the integrated dose, especially in cases where the memristor is passive and performs offline detection. This in turn can lend a memristor dosimeter to a variety of applications, from health physics & safety for radiation and medical workers to verification & inspection functions in nuclear security & safeguards. In the active mode read out, large parallel arrays of memristor detectors can function like wire chamber type detectors (e.g., hodoscopes), large serial arrays can function like ΔE/E detectors (e.g., telescopes) and can potentially have wide applications in scientific instrumentation.

In accordance with at least one embodiment of the invention, a memristor sensor is deployed in the field. The memristor may be placed on a PCB board that includes terminals connected to the electrodes of the memristor for applying voltage and/or measuring current through the memristor. In accordance with at least one embodiment of the invention, the memristor sensor does not include a power source (e.g., battery), but only one or more memristors. Prior to deploying the memristor sensor in the field, a baseline current through the memristor may be measured when a baseline voltage (e.g., 0.5 V) is applied across the memristor. When the memristor is retrieved from deployment, a current value through the memristor may be measured when the baseline voltage (e.g., 0.5 V) is applied across the memristor. The current value is indicative of the radiation level that the memristor sensor was exposed to during the deployment. The current value may be compared to the baseline current to generate a radiation value.

In accordance with at least one embodiment of the invention, a memristor sensor system may include one or more memristors, a voltage source, processing logic, and wireless communication circuitry. The processing logic (e.g., microprocessor or FPGA) causes the voltage source (e.g., 0.5 V) to be periodically applied to the memristor. Each time the voltage source is applied, the processing logic also measures the current through the memristor, which is indicative of the radiation that the memristor has been exposed to. The processing logic may report the current measurements to the wireless communication circuitry (e.g., Bluetooth, WiFi, 3G, 4G) which then broadcasts the current measurements to a mobile device, computer, or server, for example. The current measurements indicate the level of radiation that the memristor has been exposed to. The memristor sensor system may include more than one memristor and the processing logic may measure the current (by applying the voltage source) to more than one memristor and report the results of more than one memristor.

As an example, sol-gel/drop-coated micro-thick TiO2 memristors may be utilized for low-power radiation sensing. Devices constructed with coated aluminum (Al) electrodes exhibited unipolar I-V characteristics with dynamic turn-on voltage, and progressive ROFF/RON ratio loss under applied bias. Endurance failure of micro-thick Al/Al stacks may be ascribed to gradual passivation of Al surface resulting from an electrically-enhanced oxygen-ion diffusion. By exchanging a single Al contact with higher work function copper (Cu) metal, two distinct superimposed TiO2 phases may be formed. The TiO2 coating on Al surface may be carbon-contaminated and amorphous, while that on Cu may be additionally doped with Cu(I/II) ions resulting from the corrosion of the surface of the electrode by the amine-based gelation agent. After initial forming, the hybrid stack can achieve a bipolar memristance, with high ROFF/RON (up to 106), and over 10 switching cycles at low-operating voltages (±1 V). The enhanced memristive switching properties of Al/Cu devices may be explained via cooperative valence-change/electrochemical-metallization processes, involving migration of oxygen and copper species. The advanced micro-thick TiO2 memristors may be exposed to Cs-137 g-rays to demonstrate radiation detection capabilities. The sensing mechanism through these devices may be actuated by synergistic radiation-induced and/or field-driven photo-electric effects.

Micro-thick TiO2 memristors with Al or Cu electrodes may be constructed utilizing sol-gel drop-coating. Memristive switching in some structures may not be viable due to resistance build-up. Drop-coated Cu electrode may be corroded by ethanolamine additive, introducing Cu(I/II)-cations into bulk TiO2. Bipolar memristance in Al/TiO2/Cu(I/II) doped-TiO2/Cu structure may occur. In accordance with at least one embodiment, sensing g-rays with micro-thick memristors is enabled with memristive-based radiation detection.

Memristive devices may be utilized for environmental health and safety applications. Ionizing electromagnetic radiation detection and dosimetry has been a worldwide deal for general security purposes, particularly with regard to human exposure to x-rays and g-rays. which are very harmful due to their accumulative susceptibility and to their deleterious ionizing nature. These radiations are extensively deployed for good purposes in research, medical imaging, radiation therapy, manufacturing, and environmental remediation. They are also very frequently encountered in nuclear power plants and military industries, due to being primarily associated with the production, handling and storage of hazardous materials and radioactive wastes. Thus, frequent monitoring is mandatory to enhance public safety against undesired exposure due to accidental or hidden threats.

Radiation-protection dosimeters based on (i) gasionization chambers, (ii) inorganic or organic scintillation (i.e., thermoluminescent) crystals, (iii) radiographic or radiochromic dyes and (iv) semiconductor technologies, have multiple shortcomings associated with either high power supply requirement, time consuming readout and calibration, lack of accuracy, low spatial resolution, or dynamic sensitivity with accumulated dose or temperature change. Continuous advancements of existing technologies are hence necessary to simultaneously tackle the portability, recyclability and real-time monitoring faults.

Micro-thick TiO2 memristors made with aluminum (Al) electrodes exhibited a memristive I-V behavior, while others constructed with both gold (Au) or mixed Al/Au contacts completely failed to electrically switch under external bias. Devices are functional within ±6 V sweep window, giving a maximum ROFF/RON<<10, without electroforming. The sol-gel drop-coating approach may be enhanced to allow the development of microthick memristors with suitable I-V properties for potential use in g-ray sensing.

Drop-coated TiO2 memristors were constructed. Typically, 10 ml 2-methoxyethanol (99.9%) as solvent, 2.5 ml titanium (IV) iso-propoxide (99.999%) as titania precursor and 1.0 ml ethanolamine (>99%) as gelation agent and amine additive, were introduced into a pre-dried three-necked flask, under atmospheric room temperature conditions. The mixture was subjected to constant stirring under dried nitrogen flow, and was progressively heated to reflux at 80° C. for 1 h, followed by 120° C. for 30 min. The reaction container was subsequently allowed to cool to room temperature before adding 10 ml dried methanol (HPLC-grade, >99.9%) and turning off the nitrogen flow. The obtained solution was stored in a tight polypropylene bottle to slow-down side polycondensation reactions induced by atmospheric humidity (average relative value 50%), and to further minimize the adsorption of metal-oxide precursors onto the inner walls of the container. Differently, the final sol mixture (containing approximately 0.4 mmol-Ti/g-solution) was applied for coating without further purification or dilution.

Drop-coated memristor prototypes were fabricated with low cost materials purchased from local bookstore and electronic shops. Typically, two layers of flexible polyethylene sheets (individual film thickness=100 μm) were utilized as plastic substrate for each electrode. Al and Cu foil tapes (metal thickness<50 μm) were applied as electrode materials.

Typically, two narrow strips of Al or Cu foil tape were separately mounted on precut plastic substrates. Then, 4.0 ml of metal-oxide precursor solution was dropped onto each metal electrode. The drop-coating procedure was repeated five times with an interval evaporation-drying time of 10 min between applications (The overall amount of precursor dropped was roughly equivalent to 7.2 mmol of Ti). The coating was left to dry overnight for 15 h under atmospheric room temperature conditions, giving an amorphous TiO2 phase (a-TiO2). To construct a device, a strong fast acting ethyl cyanoacrylate adhesive was used to stack the drop-coated electrodes orthogonally in a crossbar MIM geometry (e.g., see the crossbar geometry depicted in FIG. 1), making an active area of about 2 m×2 mm.

To understand and optimize the resistive switching properties of micro-thick TiO2 memristors presented here, several devices were investigated based on different combinations of Al and Cu electrodes.

Figure 6:
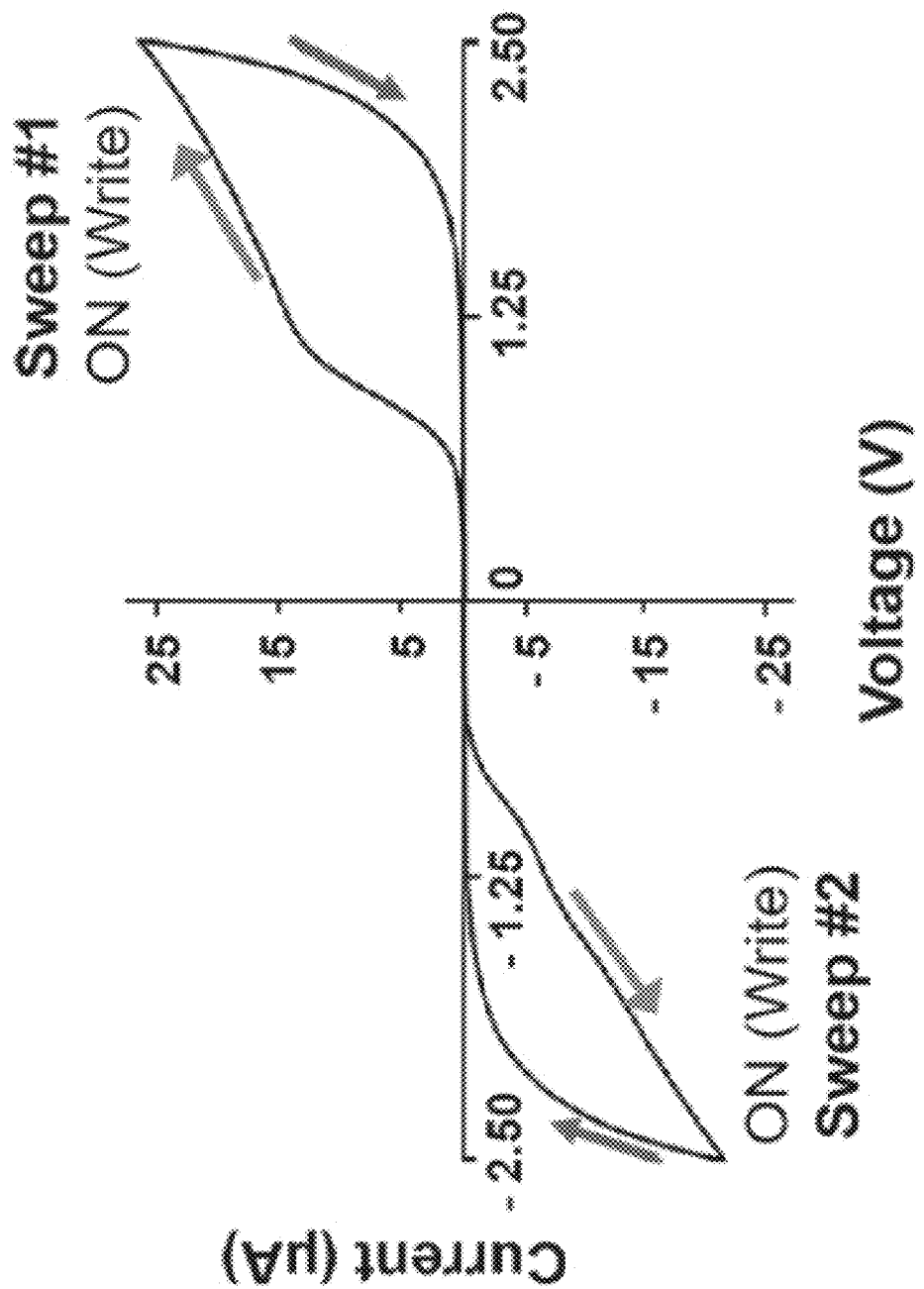
FIG. 6 is a graph depicting aspects of example device characteristics in accordance with at least one embodiment of the invention.

Micro-thick TiO2 memristors with Al/Al electrodes A batch of drop-coated Al/a-TiO2/Al memristors (devices D1, n>10) were assessed in terms of I-V curve characteristics. As depicted in the FIG. 6 example, a microscale Al/a-TiO2/Al memristors generally exhibits a pinched hysteresis I-V curve with clockwise loop regardless of the voltage polarity. The bidirectional turn-on behavior is observed below 1 V threshold magnitude. The current measured on a pristine device originally subjected to an initial positive voltage sweep, reaches about 30 mA at +2.5 V. In contrast to a classic unipolar switching mode, the device do not retain an on state after being turned on. On removing the bias, the device returns to higher resistance state than that initially observed. On flipping the sweep polarity, the device is gradually turned on but eventually retains again a higher resistance state when the bias is removed.

Figure 7:
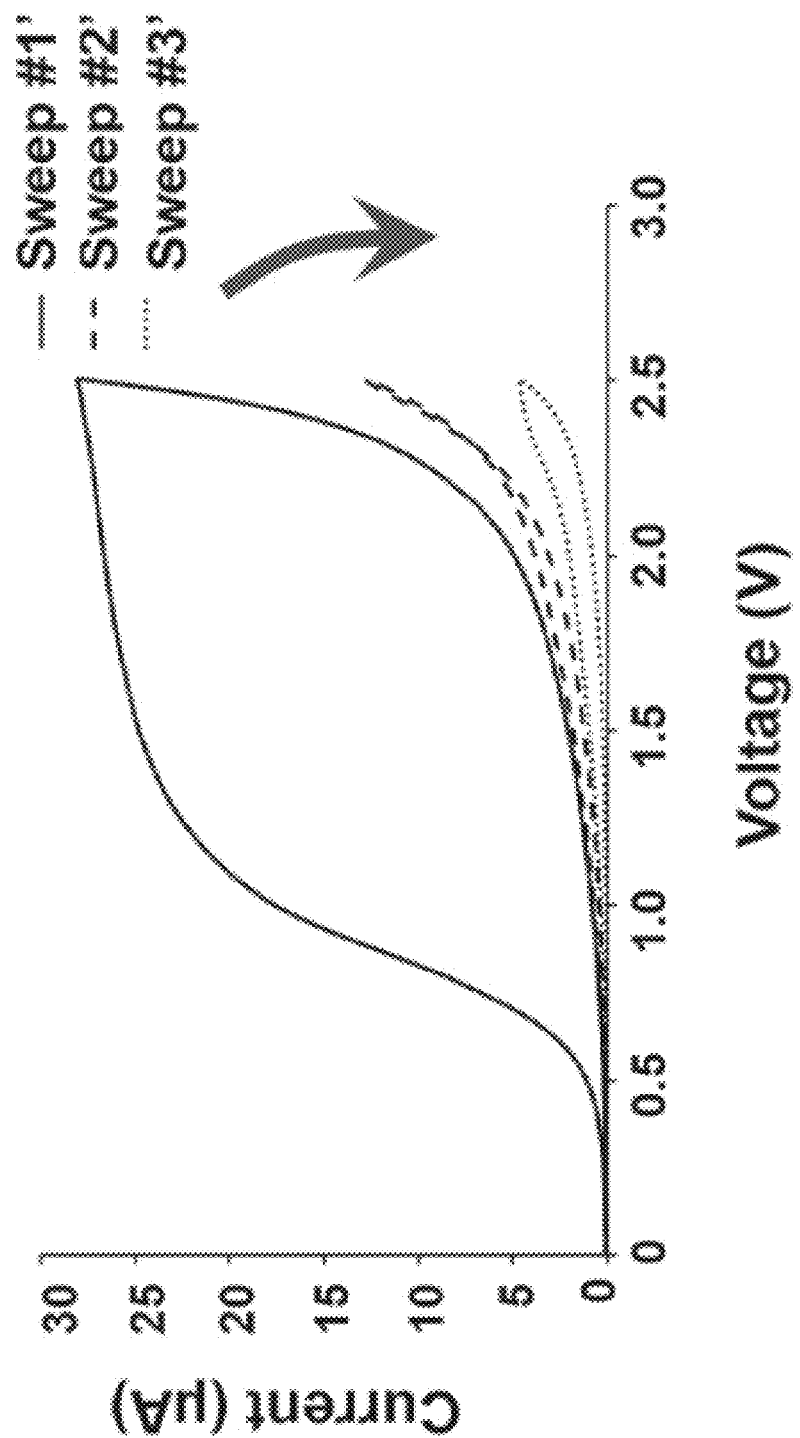
FIG. 7 is a graph depicting aspects of example device characteristics in accordance with at least one embodiment of the invention.

The device D1 may be subjected to repeated voltage sweeps from 0 to +2.5 V, as illustrated in FIG. 7. Following to the first sweep (#1'), the clockwise I-V loop recorded with the device gradually declines towards lower current values, and becomes further pinched (sweeps #2' and #3'), which indicates a progressive buildup of internal resistance. On every new sweep, a higher threshold voltage was always found required to achieve an equal or higher flux to that recorded in the preceding run. The cumulative internal resistance and increasing turn-on threshold voltage observed both suggest that a long-term interfacial chemical change is induced within the device upon electrical operation. Device limitations may be explained by a dynamic formation of a passivation layer of aluminum oxide species, increasing the Schottky barrier energy at both a-TiO2/Al junctions as the metal/insulator interface is chemically altered after successive voltage sweeps.

Figure 8:
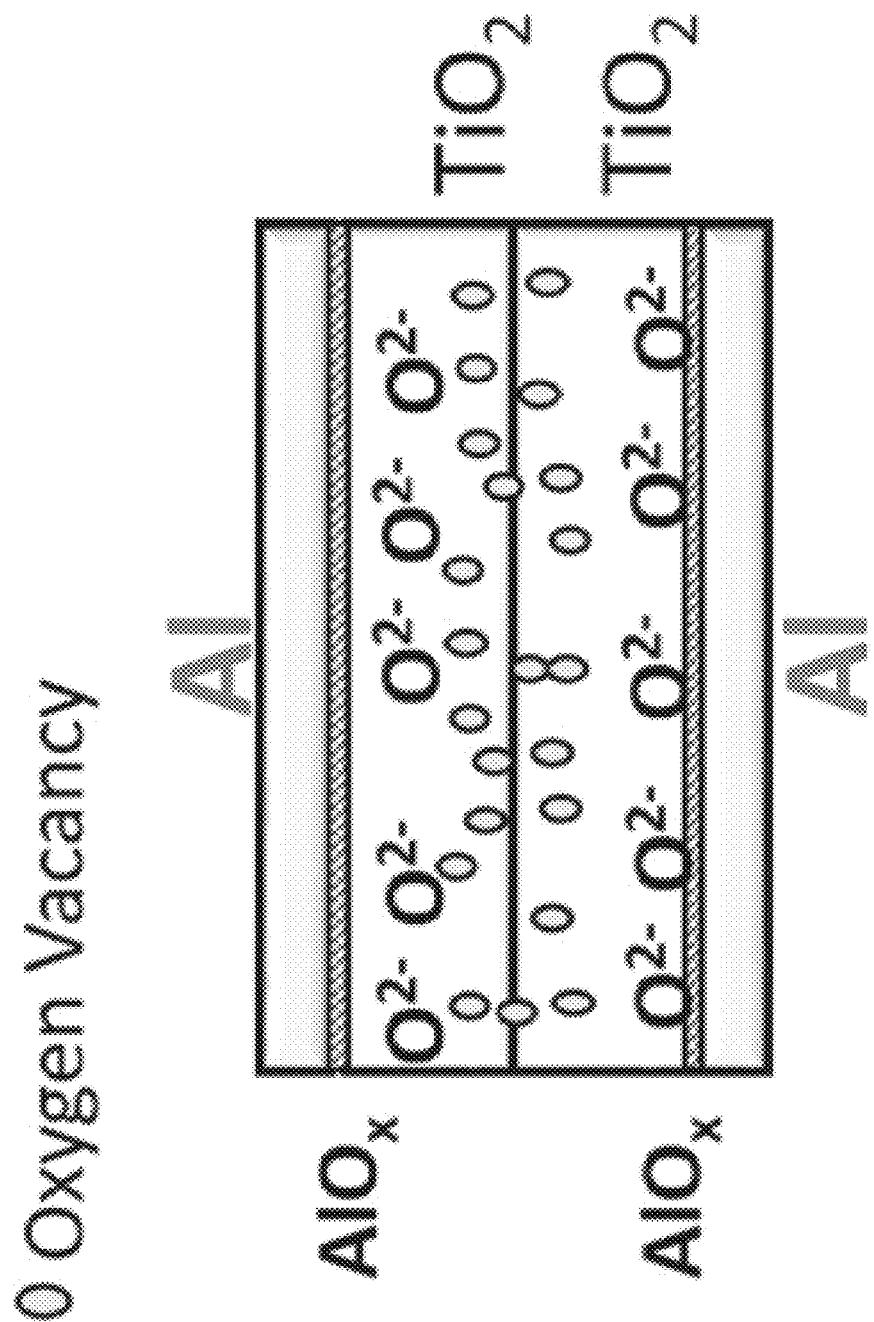
FIG. 8 is a schematic diagram depicting aspects of an example memristive device in accordance with at least one embodiment of the invention.

To elucidate how the passivation layer is electrically generated in microscale Al/a-TiO2/Al memristors (devices D1), a valence change switching mechanism involving the migration of oxygen ions and subsequent creation of conductive nano-filamentary vacancy channels is assumed. The intrinsic electrical conductivity of the sol-gel derived a-TiO2 is correlated with the presence of ionic point defects (e.g., interstitial Ti3$k$ and oxygen vacancies), which occur due to high carbon contamination under atmospheric room temperature processing conditions usually leaving behind unreacted alkoxide moieties. In this work, semi-quantitative X-ray microanalysis (EDX) of the inner surface of pristine drop-coated Al electrodes (at ~1e2 mm penetration depth) reveals the presence of non-stoichiometric AlOx phase, where x ~0.26 (±0.03). The sub-stoichiometric AlOx layer (0<x<<1.5) depicted in FIG. 8, would occur beyond atmospheric corrosion of aluminum surface due to further oxidation induced by the alkaline sol-gel ethanolamine additive.

Consequently, an oxygen-rich and oxygen-deficient region exist at the Al/a-TiO2 interface and in the bulk a-TiO2 layer, respectively. Considering the strong oxygen affinity of aluminum (as inferred from the high heat of formation of Al2O3 compared to that of TiO2), progressive diffusion of interfacial oxide ions can occur onto Al surface, increasing the population of oxidized species until thermodynamic equilibrium is achieved.

Figure 9:
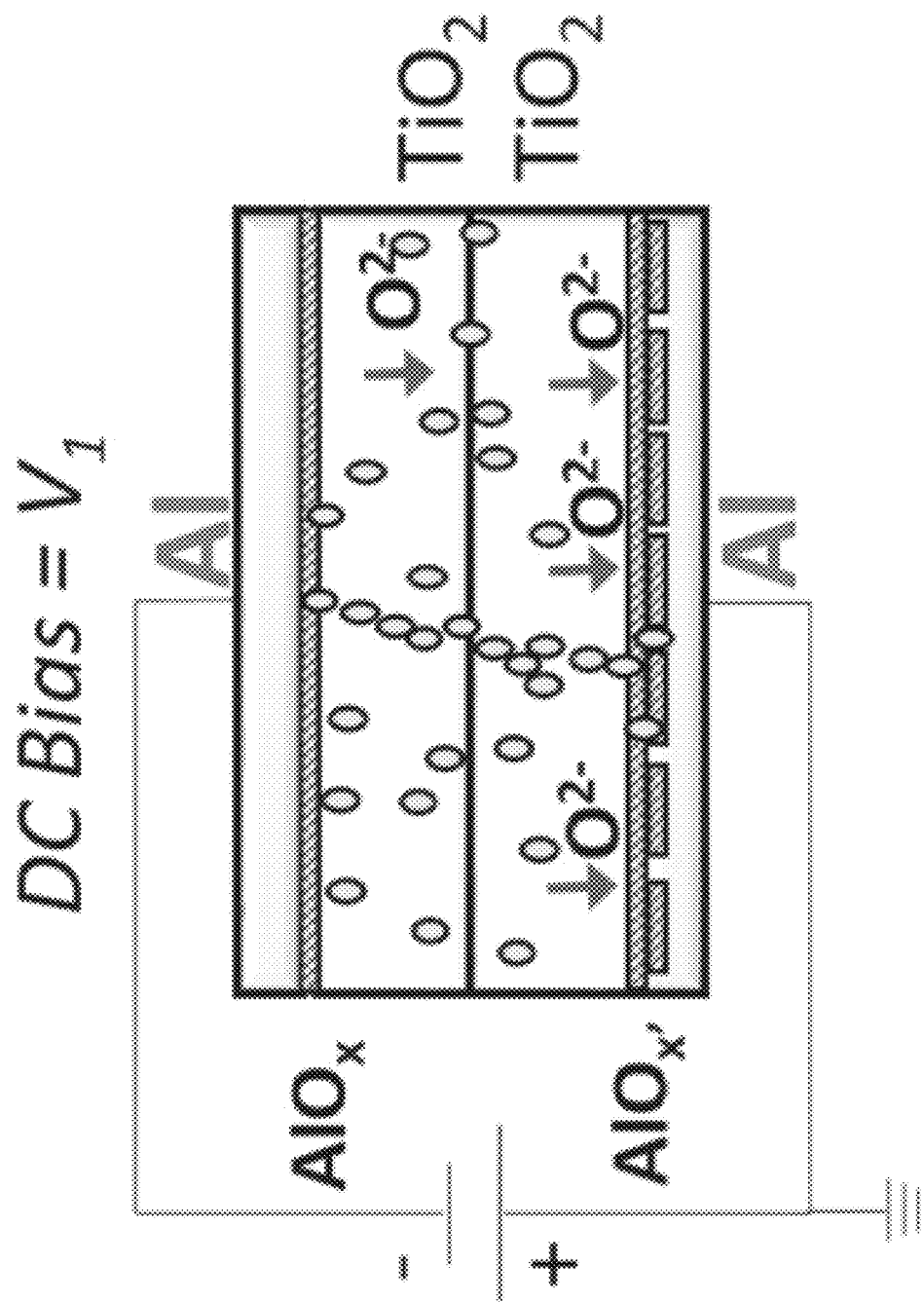
FIG. 9 is a schematic diagram depicting aspects of an example memristive device in accordance with at least one embodiment of the invention.
Figure 10:
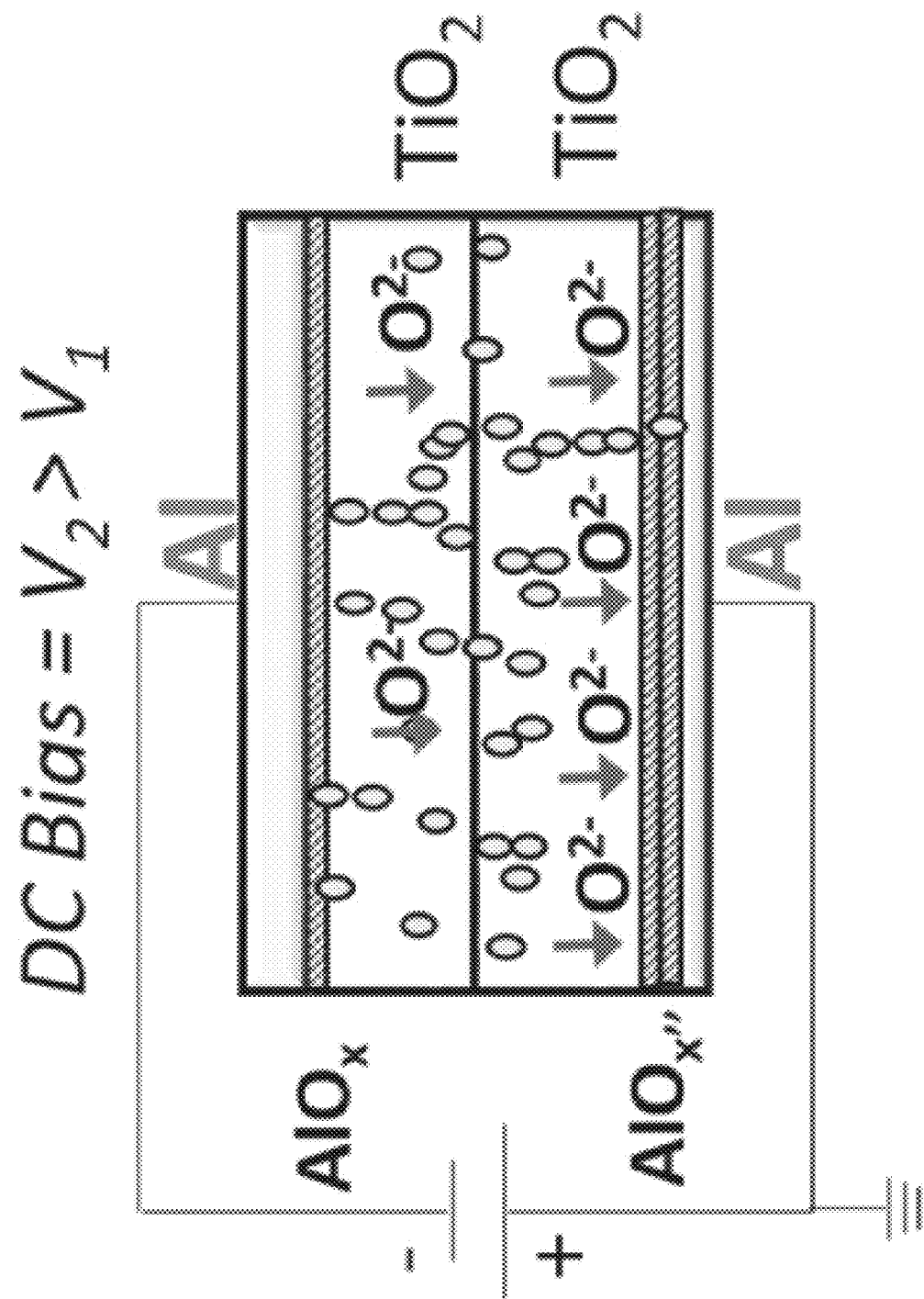
FIG. 10 is a schematic diagram depicting aspects of an example memristive device in accordance with at least one embodiment of the invention.

Considering a chemically closed memristor system, when a relatively small negative bias is applied onto one of the Al contacts (see FIG. 9), lattice oxygen atoms existing within the a-TiO2/AlOx interface drift-away from the negatively charge electrode via joule heating and field transport, leaving behind oxygen vacancies. When enough extended vacancy defects form initial conductive filaments, a switch-on current may be generated. At the same time, other oxide anions accumulate near the positively charged aluminum electrode, increasing gradually the population of AlOx species owing to enhanced diffusion equilibrium. Similar interfacial microscopic changes have been evidenced by investigating the "set" and "reset" processes in nanoscale Al/a-TiO2/Al memristors, using high resolution transmission electron microscopy (HRTEM) and X-ray photoelectron spectroscopy (XPS) techniques. In microscale devices, the passivation layer progressively developing under the applied bias (see FIG. 9) creates a screening effect for weaker conductive filaments, which causes the overall device resistance to raise as seen from the reduced passing currents in FIG. 7 (sweeps #2' and 3'). To maintain the level of flowing current, the bias magnitude needs to be increased (see FIG. 10), to strengthen and force a number of the existing filaments through the passivation layer. Reversing the bias polarity from stage 2 or 3, would produce similar cascade diffusion phenomena onto the opposite electrode, without promoting electrical breakdown of the earlier-formed passivation. The unipolar and increasingly resistive switch on property of Al/a-TiO2/Al memristors is seen with micro-sized TiO2 thicknesses, as opposed to nanoscale geometries giving the bipolar turn-on/turn-off behavior.

Using isothermal I-V mapping studies, it may be found that the bipolar resistance switching behavior in nano Al/a-TiO2/Al memristors is governed by an interplay between a bulk trap controlled space-charge-limited current (SCLC) and an Al/TiO2 interface-controlled Schottky emission, involving oxygen-ion diffusion. In accordance with at least one embodiment of the invention, back and forth drifting or diffusion of oxygen and vacancy species from Al/a-TiO2/Al junctions can be more facilitated through nano-TiO2 thicknesses acting as smaller oxygen source as opposed to micro-metal-oxide layers. In conclusion, the resistive switching mechanism in micro-thick Al/a-TiO2/Al devices can be considered highly dominated, and rather quenched by the dynamic interfacial passivation of the aluminum electrodes. Failure to restitute the memristive functionality of these devices, in addition to their very limited ROFF/RON performance (~2.5), were both regarded as major disadvantages for implementing micro-thick oxide-based Al/Al-memristors in radiation sensing measurements.

Figure 11:
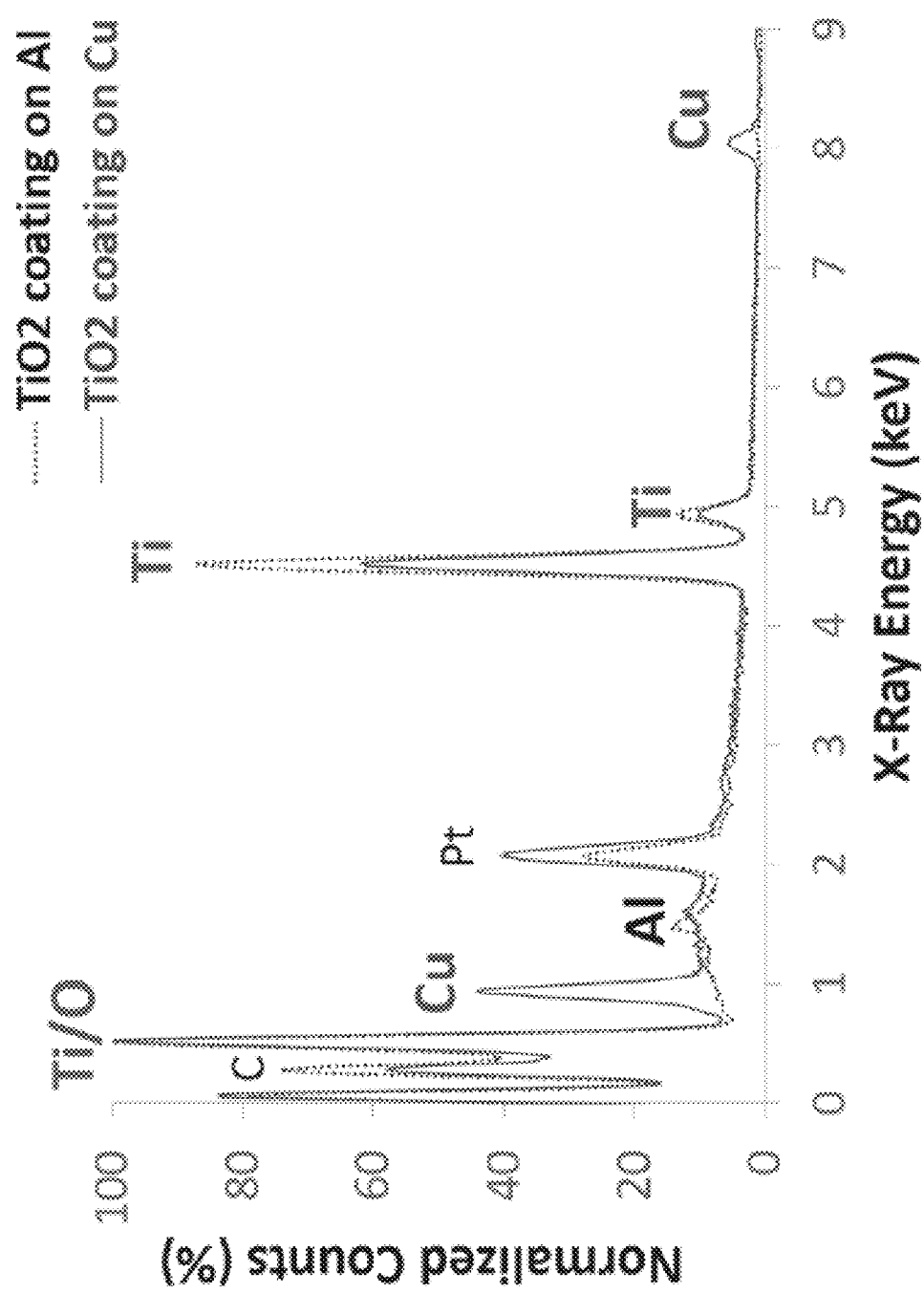
FIG. 11 is a graph depicting aspects of example device characteristics in accordance with at least one embodiment of the invention.

Micro-thick TiO2 memristors may have Al and Cu electrodes. To improve the electrical performance of micro-thick a-TiO2 memristors, substitution of aluminum with a higher work-function electrode, such as copper (4Cu~5.1 eV; 4Al~4.26 eV) may address the irreversible passivation problems mentioned. Copper is a relatively cheap noble metal with low affinity for oxygen chemisorption as inferred from the positive standard heat of formation of copper oxide species. Compared with the yellow aluminum coating, the TiO2 layer deposited onto copper surface had a blue/black appearance, inferring that a side-corrosion reaction had taken place during the gelation step. EDX elemental analyses of the coatings, shown in FIG. 11, indicate the presence of copper element in the bulk blue/black TiO2 phase generated on copper, with a loading estimated about 1:0.27 as Ti/Cu mol ratio. The corrosion was ascribed to the reaction between the alkaline ethanolamine agent from the coating solution with copper, causing substantial release of Cu(I/II)-cations. The blue/black color resulting from room temperature drying indicates that these ions occurred in the bulk TiO2 phase as in the form of copper (II)-ethanolamine complexes and copper oxide species (Cu2O/CuO).

Electrical properties of a series of micro-thick memristors configured with either Al/Cu (D2, D20 and D200 series) or Cu/Cu stacks (D3) are described and compared to with the original Al/Al structure (devices D1) below, with results summarized in FIG. 14.

Figure 12:
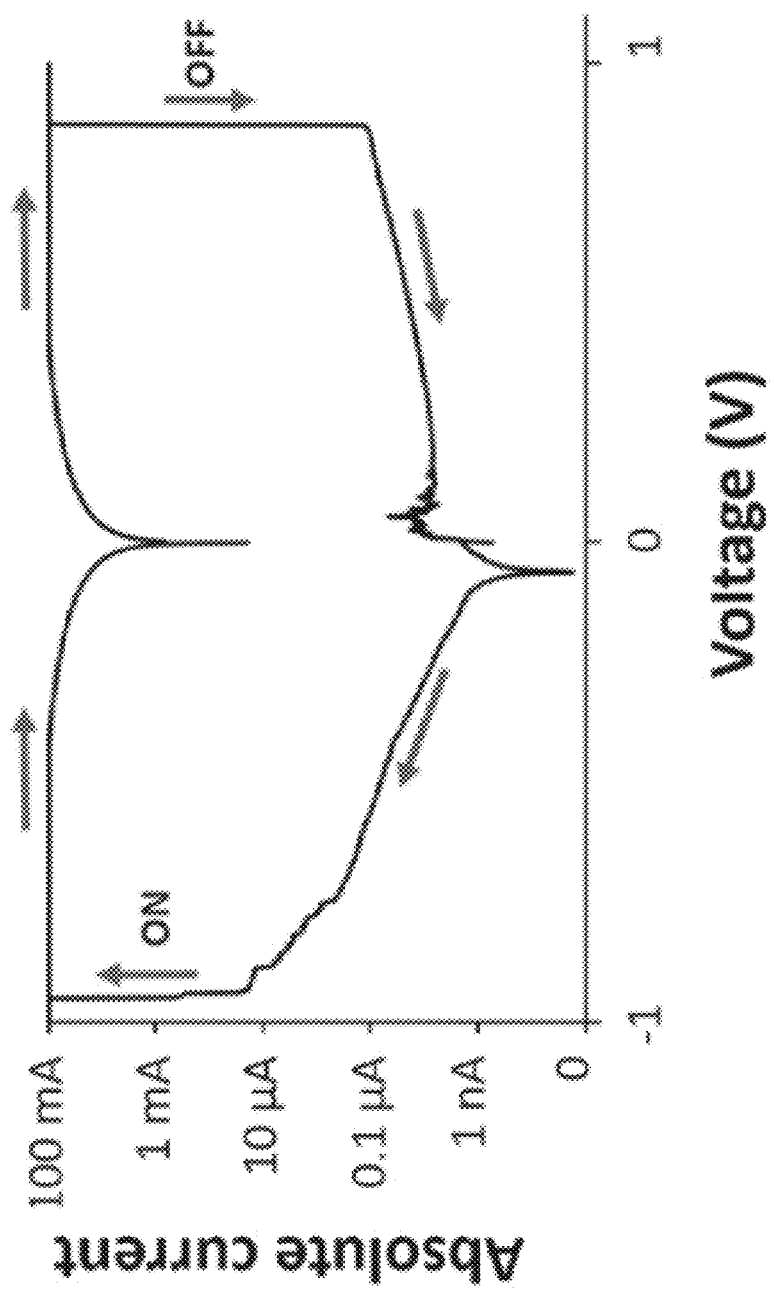
FIG. 12 is a graph depicting aspects of example device characteristics in accordance with at least one embodiment of the invention.
Figure 13:
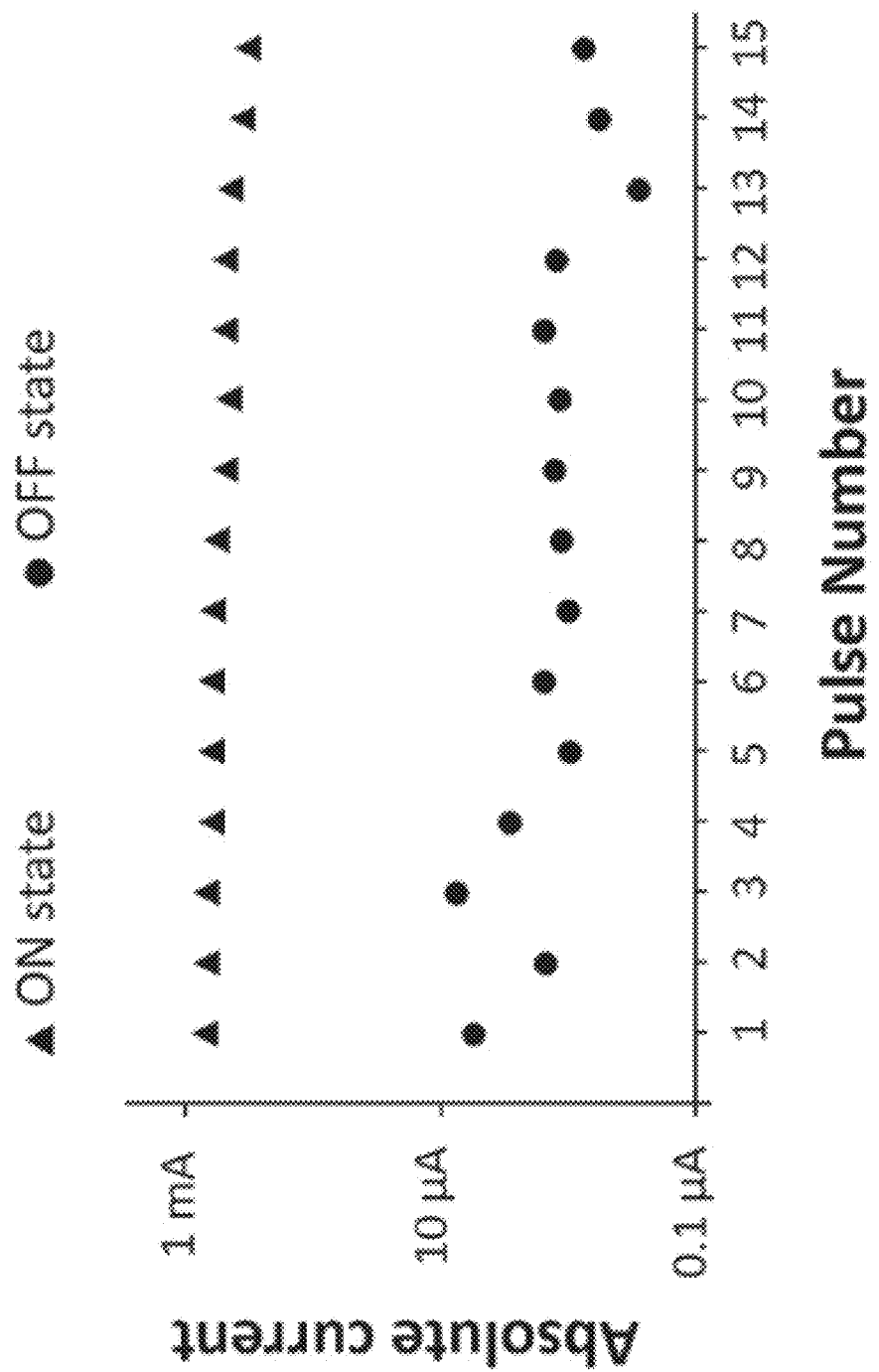
FIG. 13 is a graph depicting aspects of example device characteristics in accordance with at least one embodiment of the invention.

Al/Cu stacks containing a Cu(I/II)-doped TiO2 layer (D2 memristors) were originally found in OFF resistance state (>10 MU) after fabrication, which may have been due to enhanced absorption of atmospheric oxygen upon corrosion of the copper surface. To initiate switching events in these devices, a 5 V bias was applied onto the aluminum electrode for approximately 30 s. After electroforming, bipolar switching characteristics with "set" and "reset" operations can be observed within ±1 V window (see FIG. 12). The ROFF/RON value recorded at the maximum instrumental compliance (100 mA) is relatively very high, about 106, which is similar in magnitude to that often reported for nanoscale memristive devices. The high flowing current (limited by the instrumental compliance), indicates the creation of highly branched conductive pathways during electroforming. The basic endurance results showing the ON/OFF current levels maintained for about 15 consecutive switching cycles, in FIG. 13, demonstrate some level of electrical robustness, inferring particularly a good viability of the conductive pathways created by the forming step.

To explain the improved performance of these memristors and gain insight into their working mechanism of these memristors, cross-sectional EDX elemental analyses of a pristine versus a used stack were compared. The elemental line-scan map of the electrically cycled device revealed a higher population of oxygen species towards the aluminum side, substantiating a history of oxygen-ion diffusion that may have occurred during electroforming and the subsequent ON/OFF switching.

The evidenced oxygen-ion migration in D2 junctions can be explained by a classic valence-change resistive switching mechanism (VCM), similar to described for the Al/Al memristor (D1). However, the resettable I-V characteristics of the D2 stack, which are clearly different from the write-once behavior demonstrated for Al/Al memristors, suggests a substantial facilitating role of the mixed (Cu(I/II)eTiO2)/copper interface. Al/Cu-D20 series, prepared in absence of the corrosive ethanolamine agent in the coating solution were found highly resistive and incapable to switch-on even when longer pre-electroforming durations were applied at 5 V (e.g., 7 min compared with 30 s used for D2). In absence of ethanolamine, the chemistry of both TiO2 junctions in Al/Cu-D20 devices can be considered as close to that of Al/Al memristors (D1). Although Al/Al stacks were found to possess some switching characteristics due to the implication of the aluminum electrode, the inability of Al/Cu-D20 devices to pass the current suggests an impeding Schottky barrier formed at the TiO2eCu interface due to lower oxygen affinity of copper electrode. Consequently, having an inert electrode in conjunction with Al, does not improve the memristive switching properties of micro-thick TiO2 memristors, in agreement with previous observations with Au contacts.

Oppositely, Al/Cu-D200 memristors, made with pure ethanolamine as sole coating source (i.e., without the rectifying TiO2 phase), displayed an ohmic conductor character, which can be ascribed to faster electronic transport properties of copper oxides compared with titania (e.g., the bandgap energy ranges between 1.6 and 2.3 eV in Cu2O and CuO, respectively while it is reported above 3.4 eV in amorphous TiO2).

Figure 15:
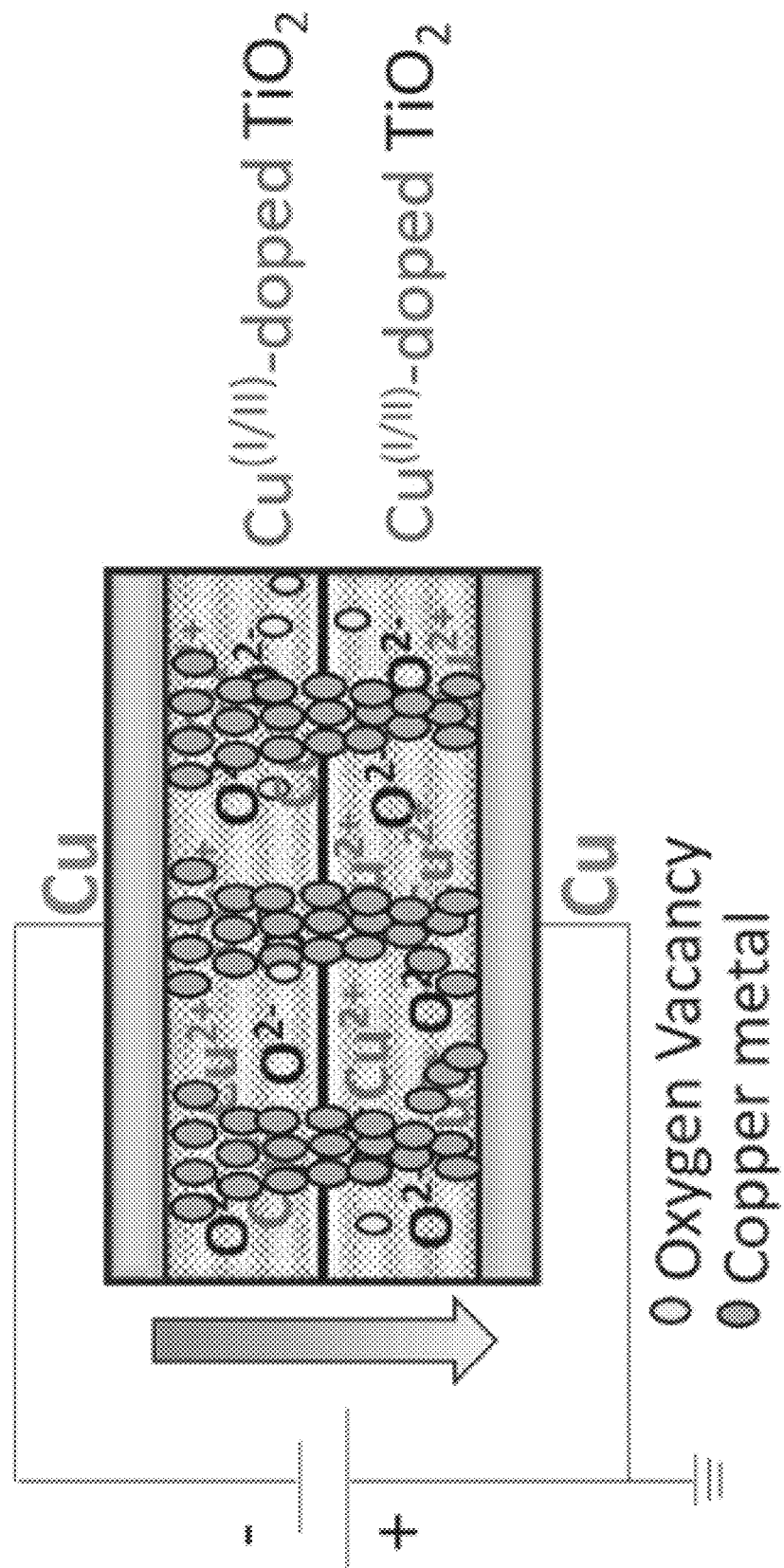
FIG. 15 is a schematic diagram depicting aspects of an example memristive device in accordance with at least one embodiment of the invention.

Furthermore, when both TiO2 junctions were doped with copper ions, as in Cu/Cu-D3 series, a single and irreversible switch-ON event was observed at 1 V, after which the "ON" state was found to be maintained as if short-circuit was in situ created. The corroded copper surface along with the copper doping found in TiO2, can create a favorable heterojunction, facilitating charge transfer at the interface between the copper metal and the semiconductor coating. In addition to that, under a voltage sweep of 1 V, copper (I/II) ions existing at the vicinity of the negatively charged Cu electrode, can be reduced into Cu0 metallic species due to lower characteristic standard reduction potential (i.e., <1 V). These copper atoms act in turn as localized negatively charged metallic contacts, promoting thus a cascade of reduction reactions of copper ions until growing metallic filaments form a closed contact with the grounded electrode. As sketched in FIG. 15, the formation of shorted paths in Cu/Cu stacks, can be explained via the electrochemical metallization (ECM) process, in agreement with observations for copper-doped ZrO2 nano-memristors with Cu/Pt electrodes.

Figure 16:
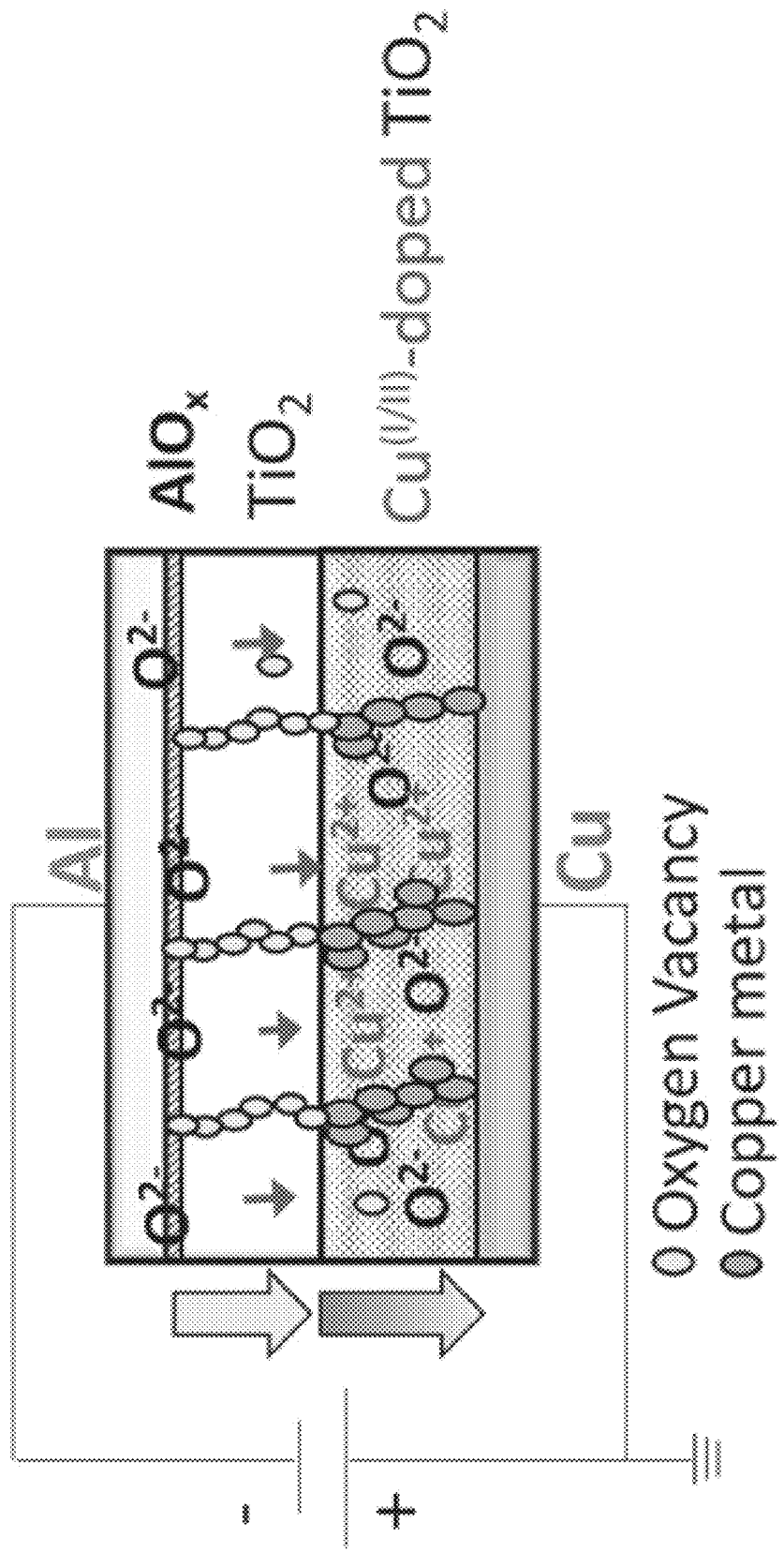
FIG. 16 is a schematic diagram depicting aspects of an example memristive device in accordance with at least one embodiment of the invention.

Based on the analysis of the various configurations of microthick TiO2 memristors, an associative ECM switching mechanism occurring within he copper-doped TiO2 junction layer is proposed to justify the reversible turn on/turn off behavior of the optimal Al/Cu-D2 memristors. The "set" operation of D2 devices illustrated in FIG. 16 can be concluded as follows: when the Al electrode is subjected to a negative bias during a switch-on operation, oxygen-ions drift away into the bulk amorphous TiO2 junction, leaving behind conductive vacancy channels, which act as carriers according to the VCM mechanism. While a same continuing mechanism can take place within the copper-doped TiO2 layer, branched conductive copper filaments (possibly initiated through the electroforming step) can additionally grow inwards towards the grounded copper electrode via a synergistic ECM process. These strong metallic filaments may explain the large amplitude of sustainable turn-on current through the device.

Figure 17:
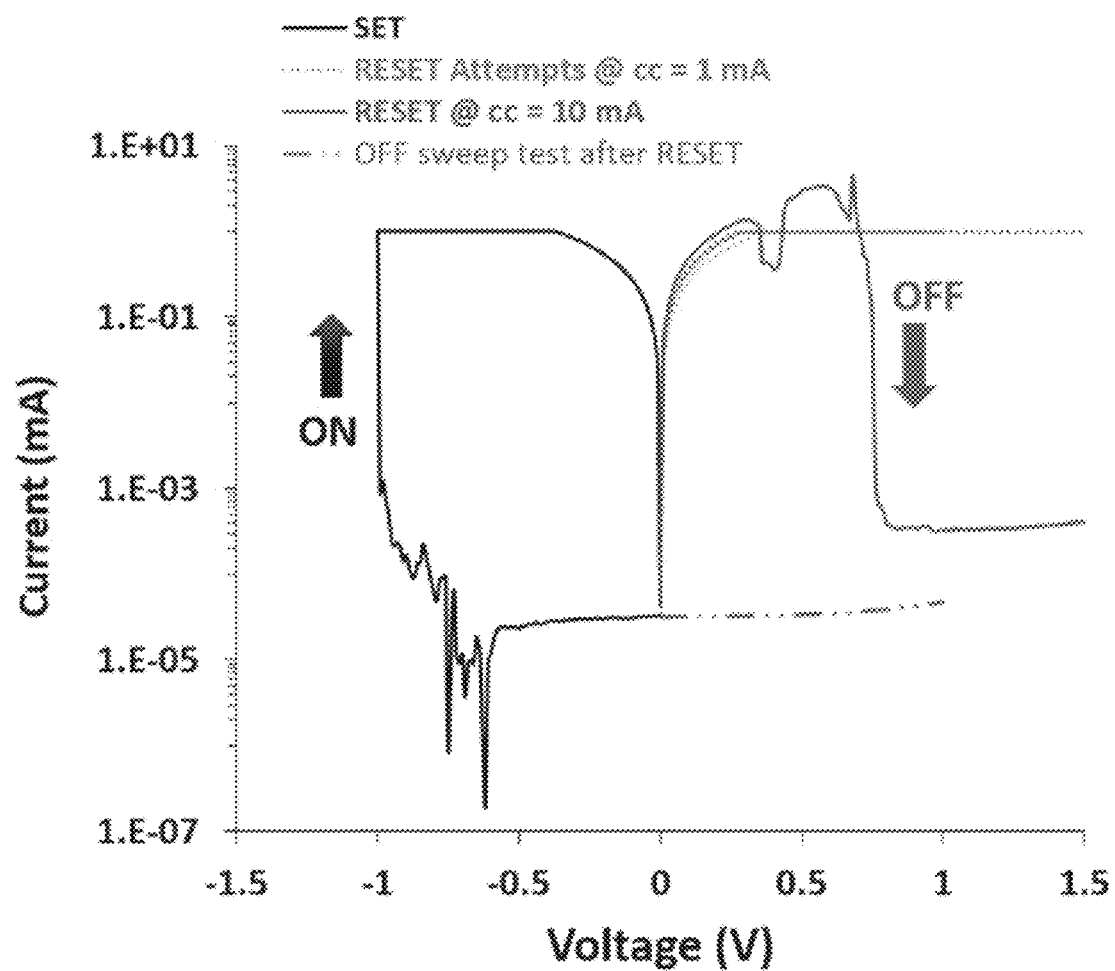
FIG. 17 is a graph depicting aspects of example device characteristics in accordance with at least one embodiment of the invention.

For the "reset" process, conductive channels have been extensively suggested to be broken by electric-field effects and localized joule heating, with the former route being more prominent in bipolar switches. Given the microscopic scale the Al/Cu-D2 memristors investigated in this work, joule heating can additionally play a substantial role in the reset behavior beyond the electric field effect that ascertains the bipolar nature. To identify the role of internal joule heating in controlling the rupture of conductive channels in the devices, a deeper exploration of the current effect (see FIG. 17) was conducted at 100 times lower compliance than the example of FIG. 12. According to the example of FIG. 17, the bipolar "set" and "reset" cycle could not be well fully achieved at 1 mA of compliance. Following to the initial negative turn-on process multiple backward sweeps to +1 V failed to switch-off the device, as observed through the grey dotted lines at 1 mA compliance level. When the compliance level was increased 10 fold, under same voltage sweep conditions (i.e., equal electric field magnitude), a small current jump was recorded above 1 mA, at about +0.6 V, after which a sharp drop in current was observed. A repeated sweep in the same mode indicate that switch-off occurred to an OFF resistance state equivalent to that observed before initial turn-on. The apex observed gives evidence of internal joule heating, while the following sudden current downturn can be associated with thermal fusion or breakdown of conductive filaments.

Micro-thick $TiO_2$ memristors may sense gamma rays. Micro-thick $TiO_2$ memristors based on the optimal Al/Cu-D2 structure may be used for radiation sensing. Due to the great understanding of the basic electronic behavior of these devices without radiation, it is possible to ascribe observations to interactions developing with the radiation sources.

Prior to radiation exposure, fresh D2 devices, were electroformed at 5 V for 30 s and tested against ±1 V sweep cycling, as reference conditions. Passive exposure to 662 keV g-rays, was first carried out by generally placing a device in contact with a Cs-137 source for a certain period of time (e.g., 5 min). Afterwards, the exposure is ceased and the resistance of the device is measured and compared to the last state recorded prior irradiation. Using this approach, no measureable change in resistance value could be observed even after prolonged exposure durations (>20 min). Failure to achieve passive sensing can either be due to (i) device transparency to g-rays (i.e., very low probability of radiation deposition within the active layer due to highly penetrating energy), or to (ii) fast non-radiative recombination of induced electron-hole pair carriers in the semiconductor junctions. Further investigations were performed in active sensing mode by continuously applying a non-switching ON voltage of 0.5 V (i.e. <1 V) to the memristor throughout radiation exposure, while monitoring the fluctuations in current measurements. A prior blank run was carried out in absence of the radiation source to verify the absence of switch-on event that can potentially be electrically-induced. According to the blue baseline 406 reported in FIG. 4, no measurable change in current was observed for about 850 s (~14.2 min) under the 0.5 V bias.

After resetting the device to the original resistance value, the same protocol may be repeated, during which the radiation source was put in contact with the operational device after 375 s from the beginning of the run. The initially nanoscale flowing current under 0.5 V bias gradually increased by 100 fold within 150 s window until it reached a value of 100 nA, which was fixed as the compliance value. When the radiation source was removed after 200 s of exposure, the current instantly dropped to 5 nA, and another turn-on was recorded 50 s earlier than that observed when the radiation was applied. Compared with the blank data, the first current jump reflects some probability of a radiation-induced conduction event. The second jump suggests persisting radiation induced phenomena that would have exerted a synergy with the small voltage bias, both inducing faster switch-on, in agreement with associative effects of optical light and voltage pulses in neuromorphic nanowire devices.

Figure 18:
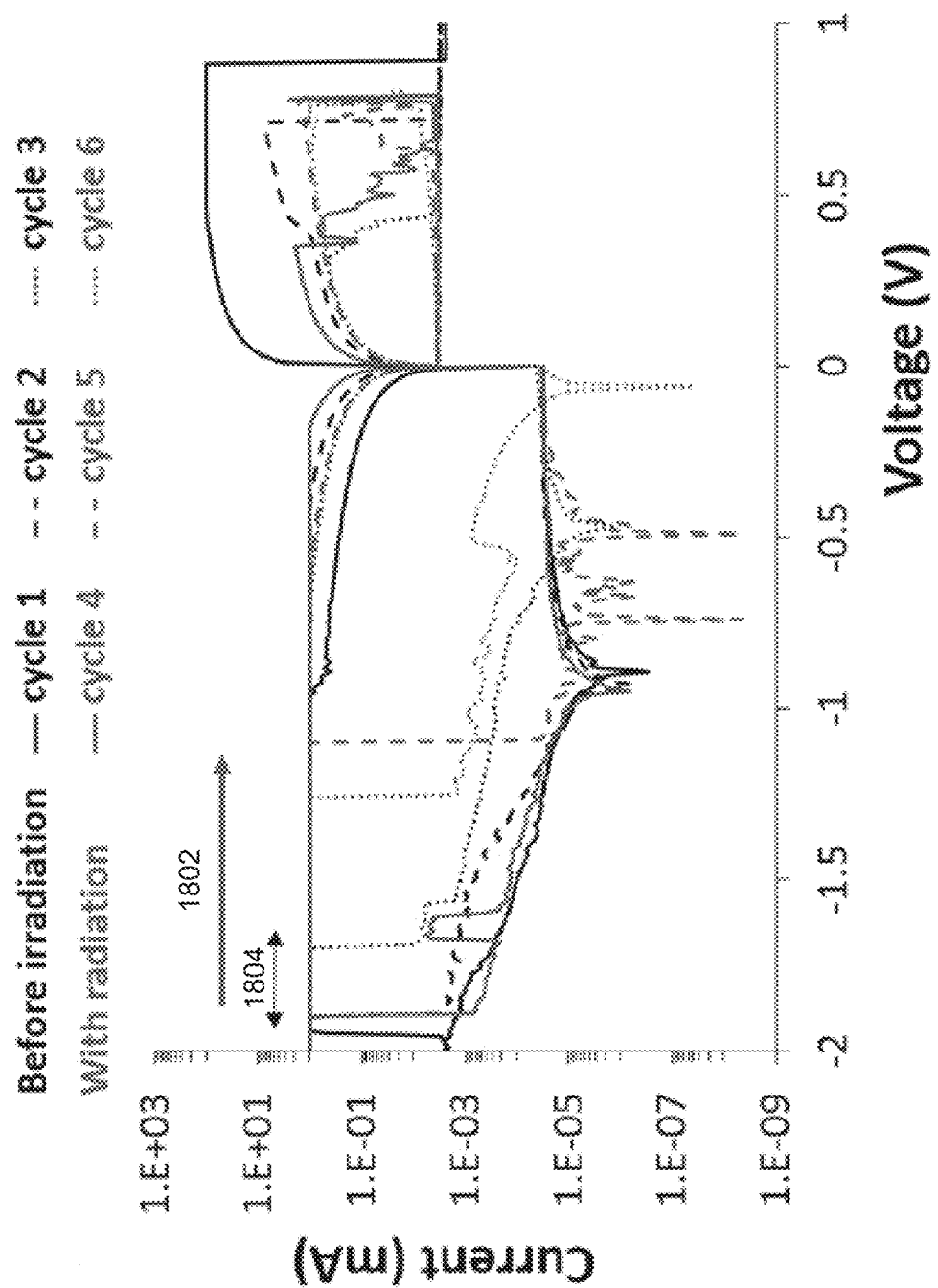
FIG. 18 is a graph depicting aspects of example device characteristics in accordance with at least one embodiment of the invention.
Figure 19:
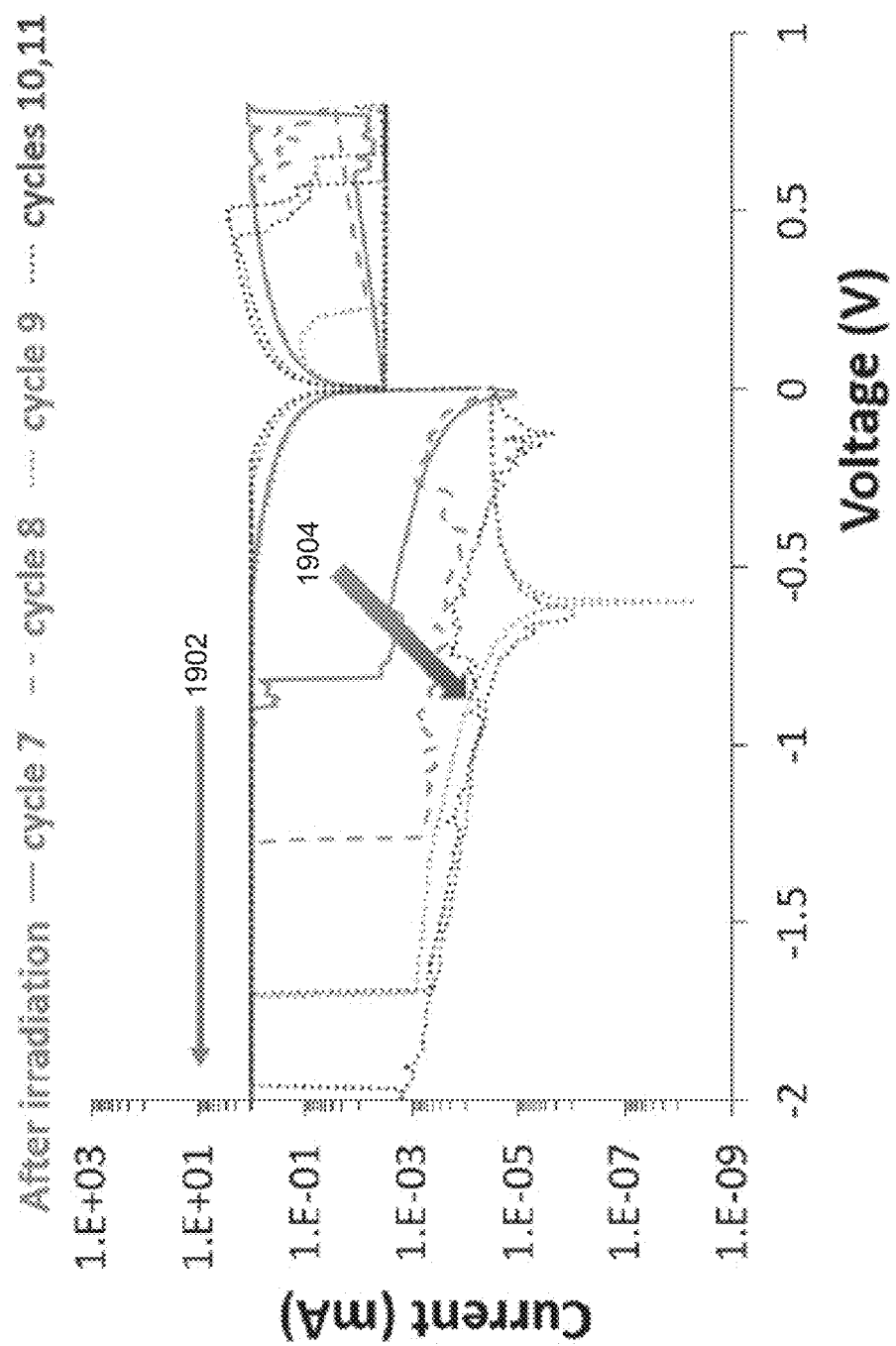
FIG. 19 is a graph depicting aspects of example device characteristics in accordance with at least one embodiment of the invention.

To ascertain the probability of radiation-induced events in facilitating the turn-on behavior of micro-thick memristors, changes in the full memristive hysteresis pattern may be determined, as illustrated in FIG. 18 and FIG. 19. For these runs, a fresh Al/Cu-D2 device was electroformed just enough to be turned on near 2 V in the negative sweep, that is at twice the voltage range of the previous examples in FIG. 12 and FIG. 17, to allow larger margin for discrimination of any voltage-related hysteresis shifts that would be caused by irradiation effects. For the first 3 successive ON/OFF sweeps done before irradiation (see FIG. 18, cycles 1, 2 and 3/black curves) the turn-on threshold voltage was about 1.84 V (±SD ¼0.14 V), with a small spread (see arrow 1804) showing good electrical endurance. During irradiation with the Cs-137 662 keV g-ray source (see FIG. 18, cycles 4, 5 and 6/gray curves), the initial turn-on voltage corresponding to cycle 4 (equal to 1.70 V) was found within the spread of measurements of the preceding blank runs. Following to cycle 4, faster switch-on was observed in both cycles 5 and 6 (see arrow 1802), with both turn-on voltage values being outside the 3 SD range of the blank measurements. The faster turn-on indicates the formation of extra conductive pathways across the memristor during g-irradiation. However, the time lag observed on sensing typical shift indicates threshold and time-dependent accumulative dose effects, both controlling the limit of detection and the response time of the memristor. To understand these observations, five blank runs were repeated subsequently after the radiation source was removed (see FIG. 19). In the starting blank cycle 7, the memristor turned on further faster than during the concluding cycle 6 of irradiation. During the next cycles 8 through 11, the threshold turn-on voltage progressively turned back close to its original value recorded before irradiation (see arrow 1902). These results indicate a temporal dissipation or decay of radiation-induced interactions throughout the memristive material.

Perceptible changes in the size of the negative hysteresis loop, in both FIG. 18 and FIG. 19, provided further evidence of the sensing phenomenon from a different view that is based on the evolution of the hysteretic gap between the turn-off and turn-on currents. In this case, the ability of the memristor to detect g-rays can also be traced from measurable changes seen in the ROFF/RON ratio of the device. Since the turn on current was fixed by the compliance value, the changes in the size of the hysteresis gap reflected gradual modification of the ROFF value. In FIG. 18, the ROFF value concluded from the turn OFF current in the negative loop is found to be going further smaller under g-irradiation. Since the ionizing radiations used are several orders of magnitude more energetic than the semiconductor's bandgap, the deposited energy can create a photoelectric effect that generates a population of in situ secondary electrons within the switching material. The radiation sensing mechanism would hence be established on reading a lower device OFF resistance state (or higher OFF current) when enough charge trapping or tunneling leakage is generated across the device. Both smaller OFF resistance state, and shorter turn-on onset support the idea of a synergistic actuation pathway in active sensing mode: while g-ray interactions could have participated in generating additional population of labile secondary electrons/holes pairs by photo-electric effect; the external electric field applied would have substantially minimized the recombination rate of these carriers by promoting charge transport. In FIG. 19, seeing the gap gradually restoring back to its original magnitude in absence of the radiation source (as indicated by arrow 1904), concludes that the memristor's response time is not instantaneous and would require further material optimization for real time monitoring applications.

At the micro-thicknesses level, the electrode material was particularly found to play a crucial role in the resistive switching mechanism of sol-gel derived TiO2 memristor devices. Particularly, a high oxygen getter metal such as aluminum was found to yield inherent resistance due to enhanced surface passivation under external electric field effects. As a result, resistive switching in Al/a-TiO2/Al memristors is difficult to achieve and such devices would be more suitable for write-once applications due to their low endurance. In-situ asymmetric metal-ion doping of the memristor insulator junction, next to a higher work-function metal such as copper, chosen in replacement to one aluminum contact, was found to particularly improve the memristive switching properties at microscale levels. Drop-coated micro-thick Al/Cu TiO2 memristors with a one-pot Cu(I/II)-doped region formed by sol-gel corrosion of the copper electrode, were found to exhibit highly attractive electrical switching properties, such as high OFF/ON resistance ratio of up to 106, bipolar memristive behavior requiring low "set" and "reset" voltages, and promising endurance. The reversible switching behavior of these devices can be explained due to harmonious valence change and electrochemical metallization mechanisms, respectively occurring within the two stacked un-doped and Cu(I/II)-doped TiO2 junctions, and accompanied with joule heating effects. The functional devices were found capable of sensing 662 keV g-rays under non-switching bias application either through observable shifts in the threshold turn-on voltage or changes in the OFF/ON current or resistance gap of the "set" hysteresis curve.

Non-limiting example embodiments are set forth below.

Example 1 is a method of measuring radiation, the method including: exposing a memristor to radiation during a first period of time; measuring a signal current through the memristor after the first period of time, wherein the signal current is measured while a voltage value is applied to the memristor; and generating a radiation measurement based at least in part on the signal current measurement. Example 2 is a method in accordance with example 1, wherein: the method further comprises measuring a baseline current through the memristor prior to the first period of time while applying the voltage value to the memristor; and the radiation measurement is further based at least in part on the baseline current measurement. Example 3 is a method in accordance with examples 2, wherein the radiation measurement is based at least in part on a difference between the signal current measurement and the baseline current measurement.

Example 4 is a method in accordance with examples 1-2 or 3, wherein the memristor is a component of a sensor and the voltage value is applied continuously during sensor operation. Example 5 is a method in accordance with examples 1-3 or 4, wherein the voltage value is applied intermittently and a corresponding radiation measurement is generated during each application of the voltage value. Example 6 is a method in accordance with examples 1-4 or 5, wherein the applied voltage value is a predetermined reference value during each application. Example 7 is a method in accordance with examples 1-5 or 6, wherein the radiation measurement corresponds to a level of gamma ray exposure during the first time period.

Example 8 is a method in accordance with examples 1-6 or 7, wherein the radiation measurement corresponds to a level of x-ray exposure during the first time period. Example 9 is a method in accordance with example 1-7 or 9, wherein the memristor has a surface area and a thickness, and the surface area is at least ten times greater than the thickness. Example 10 is a method in accordance with example 9, wherein the surface area is at least one square micrometer. Example 11 is a method in accordance with example 9, wherein the surface area is at least ten square micrometers. Example 12 is a method in accordance with example 9, wherein the surface area is at least one thousand square micrometers. Example 13 is a method in accordance with example 9, wherein the surface area is at least one square millimeter.

Example 14 is a method in accordance with examples 1-12 or 13, wherein the memristor comprises: a first electrode; a second electrode separate from the first electrode; and an active memristor material disposed between the first electrode and the second electrode. Example 15 is a method in accordance with example 14, wherein the first electrode comprises one of: aluminum, copper, and platinum. Example 16 is a method in accordance with examples 14 or 15, wherein the second electrode comprises one of: aluminum, copper, and platinum. Example 17 is a method in accordance with examples 14-15 or 16, wherein the second electrode comprises a metal not in the first electrode. Example 18 is a method in accordance with examples 14-16 or 17, wherein the active memristor material comprises one of: TiO2, HfO2, CuO, ZnO and WO3. Example 19 is a method in accordance with examples 14-17 or 18, wherein the active memristor material is deposited with one of: drop coating, knife-casting, spraying and spin coating. Example 20 is a method in accordance with example 14-18 or 19, wherein the first electrode comprises aluminum, the second electrode comprises copper, and the active memristor material comprises TiO2.

Example 21 is a sensor for measuring radiation, the sensor including: a memristor, wherein the memristor includes: a positive electrode for coupling to a positive terminal of a voltage source; a negative electrode for coupling to a negative terminal of the voltage source; and an active memristor material disposed between the first electrode and the second electrode, wherein the active memristor material is positioned to receive ambient radiation. Example 22 is a hodoscope including a sensor in accordance with example 21. Example 23 is a telescope including a sensor in accordance with example 21.

The use of the terms "a" and "an" and "the" and similar referents in the specification and in the following claims are to be construed to cover both the singular and the plural, unless otherwise indicated herein or clearly contradicted by context. The terms "having," "including," "containing" and similar referents in the specification and in the following claims are to be construed as open-ended terms (e.g., meaning "including, but not limited to,") unless otherwise noted. Recitation of ranges of values herein are merely indented to serve as a shorthand method of referring individually to each separate value inclusively falling within the range, unless otherwise indicated herein, and each separate value is incorporated into the specification as if it were individually recited herein. All methods described herein can be performed in any suitable order unless otherwise indicated herein or clearly contradicted by context. The use of any and all examples, or exemplary language (e.g., "such as") provided herein, is intended merely to better illuminate embodiments of the invention and does not pose a limitation to the scope of the invention unless otherwise claimed. No language in the specification should be construed as indicating any non-claimed element as essential to each embodiment of the present invention.

Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

What is claimed is:

1. A sensor for measuring radiation, the sensor comprising:
    a memristor comprising a first electrode, a second electrode, and an active memristor material disposed between the first electrode and the second electrode, wherein the active memristor material is positioned to receive radiation, and wherein the active memristor material has a thickness of at least 50 μm by which the first electrode is separated from the second electrode; and
    a controller configured to generate an estimate of an amount of radiation to which the active memristor material was exposed during a period of time based on a change in resistance of the memristor over the period of time.

2. The sensor of claim 1, wherein the controller is configured to determine the change in resistance of the memristor over the period of time based on a magnitude of a first current flowing through the memristor induced by a first voltage applied across the memristor before the period of time and a magnitude of a second current flowing through the memristor induced by a second voltage applied across the memristor after the period of time.

3. The sensor of claim 2, further comprising a voltage source for applying the first voltage across the memristor and the second voltage across the memristor.

4. The sensor of claim 3, further comprising wireless communication circuitry configured to transmit the magnitude of the first current and the magnitude of the second current to an electronic device.

5. The sensor of claim 1, further comprising wireless communication circuity configured to transmit the estimate of an amount of radiation to which the active memristor material was exposed during a period of time to an electronic device.

6. The sensor of claim 1, wherein the active memristor material is positioned to receive ambient radiation directly.

7. The sensor of claim 1, wherein the thickness of the active memristor material is at least 200 μm.

8. The sensor of claim 1, wherein the active memristor material consists essentially of TiO2.

9. The sensor of claim 1, wherein the amount of radiation to which the active memristor material was exposed corresponds to an amount of gamma ray exposure during the period of time.

10. The sensor of claim 1, wherein the amount of radiation to which the active memristor material was exposed corresponds to an amount of x-ray exposure during the period of time.

11. The sensor of claim 1, wherein a surface area of the active memristor material is at least ten square micrometers.

12. The sensor of claim 1, wherein a surface area of the active memristor material is at least one thousand square micrometers.

13. The sensor of claim 1, wherein a surface area of the active memristor material is at least one square millimeter.

14. The sensor of claim 1, wherein the first electrode comprises one of: aluminum, copper, or platinum.

15. The sensor of claim 14, wherein the second electrode comprises one of: aluminum, copper, or platinum.

16. The sensor of claim 14, wherein the second electrode comprises a metal not in the first electrode.

17. The sensor of claim 14, wherein the active memristor material comprises one of: TiO2, HfO2, CuO, ZnO, or WO3.

18. The sensor of claim 14, wherein the active memristor material is deposited with one of: drop coating, knife-casting, spraying, or spin coating.

19. A hodoscope comprising the sensor of claim 1.

20. A telescope comprising the sensor of claim 1.

* * * * *